United States Patent
Takakuwa et al.

(10) Patent No.: US 7,200,907 B2
(45) Date of Patent: Apr. 10, 2007

(54) METHOD OF MANUFACTURING PIEZOELECTRIC DEVICE

(75) Inventors: Atsushi Takakuwa, Shiojiri (JP); Takamitsu Higuchi, Matsumoto (JP); Setsuya Iwashita, Nirasaki (JP)

(73) Assignee: Seiko Epson Corporation, Tokyo (JP)

( * ) Notice: Subject to any disclaimer, the term of this patent is extended or adjusted under 35 U.S.C. 154(b) by 171 days.

(21) Appl. No.: 10/944,852

(22) Filed: Sep. 21, 2004

(65) Prior Publication Data

US 2005/0097716 A1    May 12, 2005

(30) Foreign Application Priority Data

Oct. 28, 2003   (JP)   ............... 2003-367417

(51) Int. Cl.
*H04R 17/00*   (2006.01)
*H01L 41/00*   (2006.01)
*B41J 2/045*   (2006.01)

(52) U.S. Cl. ................ 29/25.35; 29/846; 310/313 A; 347/68; 347/70; 347/71; 347/72

(58) Field of Classification Search ........... 29/25.35, 29/846; 310/311, 313 A, 313 R; 264/435, 264/436; 347/100, 30, 40, 68, 69, 70–72; 427/100, 248.1, 249.18, 249.19, 248
See application file for complete search history.

(56) References Cited

U.S. PATENT DOCUMENTS

| | | | |
|---|---|---|---|
| 3,689,383 A | * | 9/1972 | De Witt ............... 205/505 |
| 5,338,999 A | * | 8/1994 | Ramakrishnan et al. .... 310/358 |
| 6,096,434 A | * | 8/2000 | Yano et al. ............... 428/446 |
| 6,198,197 B1 | * | 3/2001 | Yamanouchi et al. ... 310/313 R |
| 6,419,849 B1 | * | 7/2002 | Qiu et al. ............... 252/62.9 R |

FOREIGN PATENT DOCUMENTS

| | | | |
|---|---|---|---|
| JP | 2003-152233 | * | 5/2003 |
| WO | WO 00/75992 A1 | | 12/2000 |

* cited by examiner

*Primary Examiner*—A. Dexter Tugbang
*Assistant Examiner*—Tai Van Nguyen
(74) *Attorney, Agent, or Firm*—Oliff & Berridge, PLC

(57) ABSTRACT

Exemplary embodiments of the present invention provide a method of manufacturing a piezoelectric device that includes a piezoelectric layer having high crystallinity in which crystal orientation is aligned to a desired direction, a method of manufacturing a ferroelectric device that includes a ferroelectric layer having the similar high crystallinity, and so forth. Exemplary embodiments include an insulating layer composed of SiO2 and so forth and a buffer layer composed of strontium oxide (SrO) and so forth are formed on a substrate such as a silicon single crystal wafer in sequence, and then a lower electrode composed of strontium ruthenate (SRO) is formed on the buffer layer. By forming self-assembled monolayers on the lower electrode, high affinity regions A1 and low affinity regions A2 are formed. Then, piezoelectric layers are selectively formed only on the high affinity regions A1.

13 Claims, 13 Drawing Sheets

REUSE STAMP

METHOD OF MANUFACTURING PIEZOELECTRIC DEVICE

BACKGROUND OF THE INVENTION

1. Field of Invention

Exemplary embodiments of the present invention relate to a method of manufacturing a piezoelectric device and a ferroelectric device, a droplet ejection head, and electronic equipment.

2. Description of Related Art

A piezoelectric element, which is a type of a piezoelectric device, has a structure in which a piezoelectric layer composed of a poly-crystal, an upper electrode, and a lower electrode that are disposed in a manner of sandwiching the piezoelectric layer, are included; The piezoelectric element utilizes stress caused in the piezoelectric layer when voltage is applied between the upper and lower electrodes. In addition, a ferroelectric memory (FeRAM), which is a type of ferroelectric device, has a structure in which a ferroelectric layer, an upper electrode, and an lower electrode that are disposed in a manner of sandwiching the ferroelectric layer, are included. A ferroelectric memory is a non-volatile memory that utilizes the characteristic in which charges are accumulated in the upper and lower electrodes for a long period due to of the ferroelectricity of the ferroelectric layer. As materials for upper and lower electrodes, noble metals such as Pt (platinum) and Ir (iridium) are used. As a material for a piezoelectric layer and a ferroelectric layer, for example, lead zirconate titanate ($Pb(Zr, Ti)O_3$:PZT) is used.

These piezoelectric and ferroelectric devices are formed by pattering upper and lower electrodes, and piezoelectric or ferroelectric layer into a given shape using a photolithography technique on a substrate, such as Si (silicon). As an example, a piezoelectric layer is patterned through the following processes. First, a piezoelectric layer is formed on the whole surface of a substrate and thereafter, the upper surface of the piezoelectric layer is coated with resist. Next, the resist is patterned into a desired shape so as to form a resist pattern, and then unwanted parts of the piezoelectric layer are removed by etching and so forth while utilizing the resist pattern as a mask. Finally, the resist pattern is removed to thereby obtain a piezoelectric layer having a pattern of a desired shape. As for an upper electrode, a lower electrode, and a ferroelectric layer, patterning is implemented in similar processes.

However, there is a problem that patterning using a photolithography technique as above, contributes to an increase in manufacturing cost and manufacturing time since the efficiency in the use of a material is low and the processes become complicated. In order to address or solve the above discussed and/or other problems, related art includes a selective growth method by which patterns are selectively formed only on a desired region on a substrate. For example, International Publication WO00/075992 pamphlet discloses a method in which a lower electrode, a ferroelectric layer, and an upper electrode are selectively formed by using such a method so as to fabricate a ferroelectric memory.

SUMMARY OF THE INVENTION

When a piezoelectric device or a ferroelectric device is fabricated using the above selective growth method, a piezoelectric layer or a ferroelectric layer needs to be selectively formed on a lower electrode, and further an upper electrode needs to be selectively formed on the piezoelectric layer or ferroelectric layer. However, in the related art, forming a lower electrode having a desired orientation is difficult. Accordingly, there is a problem in that it is difficult to form a piezoelectric layer or ferroelectric layer whose crystal orientation is aligned to a desired direction, on the lower electrode with poor orientation.

Exemplary embodiments of the present invention address the above discussed and/or other problems, and provides a method of manufacturing a piezoelectric device including a piezoelectric layer that has high crystallinity in which crystal orientation is aligned to a desired orientation. Exemplary embodiments further provide a method of manufacturing a ferroelectric device including a ferroelectric layer that has similar high crystallinity, a droplet ejection head, and electronic equipment that incorporate a piezoelectric device or ferroelectric device and thus have high reliability.

In order to address or solve the above discussed and/or other problems, a method of manufacturing a piezoelectric device of exemplary embodiments of the present invention is a method of manufacturing a piezoelectric device, which manufactures a piezoelectric device including a piezoelectric layer of a given planar shape formed on a substrate. The method includes forming a lower electrode composed of strontium ruthenate on the substrate; forming, on the lower electrode, a first region having high affinity for a piezoelectric material used to form the piezoelectric layer, and a second region whose affinity for the piezoelectric material is lower than the affinity of the first region; and forming the piezoelectric layer of the given planar shape by supplying the piezoelectric material onto the lower electrode so as to dispose the piezoelectric material on the first region.

According to exemplary embodiments of the invention, the lower electrode is formed of strontium ruthenate and the piezoelectric layer of a given planar shape is formed on the first region on the lower electrode selectively. Thus, the piezoelectric layer of a desired planar shape having high crystallinity in which crystal orientation is aligned to a desired direction, can be obtained. Moreover, forming the lower electrode by strontium ruthenate enables the adhesiveness between the lower electrode and the piezoelectric layer to be enhanced, and enables the material constituting the piezoelectric layer to be reduced or prevented from diffusing into the lower electrode. Therefore, the piezoelectric device having good electrical characteristic and high reliability can be obtained.

In the method of manufacturing a piezoelectric device of exemplary embodiments of the present invention, the lower electrode is formed into (100)-orientation. According to exemplary embodiments of the invention, by forming the lower electrode into (100)-orientation, the piezoelectric layers on the lower electrode can be formed into (100)-orientation in which voltage displacement amount (deformation amount with respect to applied voltage) is large.

The method of manufacturing a piezoelectric device of exemplary embodiments of the present invention further includes forming an insulating layer and a buffer layer on the substrate in sequence prior to forming of the lower electrode.

According to exemplary embodiments of the invention, since the lower electrode is formed on the buffer layer after the insulating layer and the buffer layer are formed on the substrate in sequence, the crystallinity of the lower electrode can be enhanced.

The insulating layer is preferably formed of any of silicon dioxide ($SiO_2$), zirconium dioxide ($ZrO_2$), cerium dioxide ($CeO_2$), yttria stabilized zirconia (YSZ), and $Ga_2Zr_2O_7$, or a structure in which at least two of these materials are deposited.

The buffer layer is preferably formed of any of strontium oxide (SrO), magnesium oxide (MgO), calcium oxide (CaO), barium oxide (BaO), bismuth titanate ($Bi_4Ti_3O_{12}$), and a chemical compound having a layered perovskite structure.

Particularly, strontium ruthenate constituting the lower electrode has a perovskite type crystal structure. Therefore, forming a buffer layer by a material having the same structure, enables the crystallinity of the lower electrode to be enhanced, and further enables the crystallinity of the piezoelectric layer formed on the lower electrode to be enhanced.

In the method of manufacturing a piezoelectric device of exemplary embodiments of the present invention, the piezoelectric layer of the given planar shape is formed on the first region by supplying a mist of the piezoelectric material onto the lower electrode on which the first region and the second region are formed.

According to exemplary embodiments of the invention, since the piezoelectric material supplied onto the lower electrode is provided as a mist that includes droplets of sub micron order, the piezoelectric layers can more easily be formed with extremely high accuracy even if the piezoelectric layers formed on the first regions are minute.

In the method of manufacturing a piezoelectric device of exemplary embodiments of the present invention, the piezoelectric layer of the given planar shape is formed on the first region by depositing the piezoelectric material on the lower electrode on which the first region and the second region are formed, with CVD.

Also by exemplary embodiments of this invention, minute piezoelectric layers can selectively be formed on the first region with extremely high accuracy such that piezoelectric layers having excellent piezoelectric characteristic can be formed at low cost.

In the method of manufacturing a piezoelectric device of exemplary embodiments of the present invention, the piezoelectric layer of the given planar shape is formed on the first region with an ion beam assisted method when the piezoelectric material is supplied onto the lower electrode on which the first region and the second region are formed.

According to exemplary embodiments of this invention, the orientation of the piezoelectric layer can be controlled since the piezoelectric layers are formed by using an ion beam assisted method. In addition, the piezoelectric layers having a higher characteristic can be formed since the process temperature can be lowered.

In the method of manufacturing a piezoelectric device of exemplary embodiments of the present invention, the forming of the piezoelectric layer of the given planar shape on the first region by using an ion beam assisted method includes forming a first layer by an ion beam assisted method; and forming a second layer by continuing supply of the piezoelectric material with stopping ion beam assist.

In exemplary embodiments of this invention, at start time of forming piezoelectric layers, the first layer is formed at low process temperatures by using an ion beam assisted method, and the second layer is formed by continuing the supply of the piezoelectric material with stopping ion beam assist in the middle. Therefore, piezoelectric layers having high crystallinity in which crystal orientation is aligned to a desired direction can be formed at low cost.

The method of manufacturing a piezoelectric device of exemplary embodiments of the present invention further includes radiating an ion beam to the piezoelectric material of the given planar shape formed on the first region.

According to exemplary embodiments of this invention, after the piezoelectric layers (precursor) are formed on the lower electrode, the piezoelectric layers (precursor) are irradiated with an ion beam. Thus, piezoelectric layers whose crystal orientation is aligned can be formed at low cost.

Degreasing of at least above the lower electrode on which the first region and the second region are formed, is preferably included prior to radiation of the ion beam.

In the method of manufacturing a piezoelectric device of exemplary embodiments of the present invention, at least one of the first region and the second region is formed by using a surface modification film. According to this invention, the surface characteristic of the lower electrode can be controlled extremely easily such that the piezoelectric layer of a given planar shape can be formed without implementing etching process.

Specifically, the first and second regions are formed through the following first through third exemplary methods.

First, the first region and the second region are formed by forming the first region by using a surface modification film composed of a material whose affinity for the piezoelectric material is higher than the affinity of the lower electrode.

Second, the second region is formed by using a surface modification film composed of a material whose affinity for the piezoelectric material is lower than the affinity of the lower electrode.

Third, surface modification films of two kinds having different affinity for the piezoelectric material, are used. Then, out of the surface modification films of two kinds, the first region is formed by using the surface modification film having relatively high affinity, and the second region is formed by using the surface modification film having relatively low affinity.

In the method of manufacturing a piezoelectric device of exemplary embodiments of the present invention, at least one of the first region and the second region is formed by forming a mask layer of a given shape on the lower electrode, and then depositing the surface modification film on the lower electrode, and thereafter removing the mask layer.

According to exemplary embodiments of the invention, the first region and the second region can be formed, easily and accurately by using a general semiconductor manufacturing device. Namely, the mask layer can easily be formed by forming resist on the lower electrode and implementing exposure treatment and development treatment. Furthermore, the mask layer selectively deposited on the lower electrode can also be formed by a droplet ejection method in which a liquid material is dropped from an ink jet nozzle and so forth.

In the method of manufacturing a piezoelectric device of exemplary embodiments of the present invention, at least one of the first region and the second region is formed by depositing the surface modification film on the lower electrode and removing a desired part of the surface modification film.

According to exemplary embodiments of this invention, the first region or the second region that is made up of surface modification films of a desired shape can be formed without forming a mask layer made up of a resist pattern and so forth, namely without using photolithography and so forth.

In the method of manufacturing a piezoelectric device of exemplary embodiments of the present invention, at least one of the first region and the second region is formed by depositing the surface modification film on the lower electrode and selectively modifying a surface characteristic of a desired part of the surface modification film.

According to exemplary embodiments of this invention, the piezoelectric material can be deposited selectively by utilizing the difference in affinity for the piezoelectric material between a region in which the surface characteristic of the surface modification film is modified and a region in which the surface characteristic is not modified.

In addition, since the surface characteristic of the surface modification film can be controlled easily and accurately, the affinity for the piezoelectric material can be controlled more highly. As a result, the planar shape of the piezoelectric layer can be a desired shape with high accuracy.

In the method of manufacturing a piezoelectric device of exemplary embodiments of the present invention, the surface modification film is removed or the surface characteristic of the surface modification film is modified, by irradiating the surface modification film with at least one of an electron beam, an ion beam, and light.

An electron beam, an ion beam, and light can be focused on an extremely small spot and the position of the spot can be controlled easily and accurately. Thus, the planar shape of the piezoelectric layer can be controlled easily and accurately. Therefore, exemplary embodiments of the present invention enable extremely minute piezoelectric layers to be formed easily.

In the method of manufacturing a piezoelectric device of exemplary embodiments of the present invention, wavelength of the light is preferably equal to or less than 250 nanometers. Using light of such a wavelength range enables the surface modification film to be removed regardless of a type thereof. Therefore, a region on which the surface modification film is formed and a region not formed are accurately defined, and thereby the piezoelectric layer can be formed accurately.

In the method of manufacturing a piezoelectric device of exemplary embodiments of the present invention, a transfer mold having a given transfer shape is used and the surface modification film is deposited on a transfer surface of the transfer mold, and then the surface modification film is transferred to a given region on the lower electrode, so as to form at least one of the first region and the second region.

According to exemplary embodiments of this invention, the surface modification film formed on the transfer surface of the transfer mold is transferred to the lower electrode surface, and therefore a plurality of surface modification films having the same pattern can be formed on the lower electrode by using one transfer mold repeatedly for example. Thus, the surface modification film can be formed easily and effectively.

Transferring of the surface modification film to the lower electrode is preferably implemented by micro contact printing.

According to exemplary embodiments of this invention, the surface modification film of a desired pattern can be formed on the lower electrode by using micro contact printing (μCP), which is a type of relief printing.

In the method of manufacturing a piezoelectric device of exemplary embodiments of the present invention, self-assembled monolayers are used as the surface modification film.

According to exemplary embodiments of the present invention, since the first region and the second region are formed by using self-assembled monolayers, the shapes of the first region and the second region can be controlled extremely accurately, while the degree of affinity of such a region can be controlled with extremely high accuracy. Self-assembled monolayers (SAMs) are films fabricated by a self-assembly (SA) method, which is a method of fixing molecules to a solid surface and is a method capable of forming highly oriented and high-density molecular layers. In the self-assembly method, the surroundings and geometric arrangement of molecules can be operated by angstrom order.

With respect to the self-assembled monolayers, fabrication is easy and thermal stability of the film is high because of chemical coupling existing between molecules and the lower electrode such that the self-assembled monolayers are an important technique for manufacturing a molecular element of angstrom order. The self-assembled monolayers are formed by a self-assembling process basically, and can form a fine pattern spontaneously. Therefore, if self-assembled monolayers are used, a precise and ultra-fine pattern that can not be formed by a related art lithography methods, can be formed.

In the method of manufacturing a piezoelectric device of exemplary embodiments of the present invention, the self-assembled monolayers preferably include at least one of an organic silicon compound and a thiol compound.

According to exemplary embodiments of this invention, self-assembled monolayers constituting the first and second regions can be fabricated by using an organic silicon compound (silane coupling agent) or a thiol compound. The thiol compound is a generic term for an organic compound ($R^1$—SH) having a mercapto group (—SH). The silane coupling agent is a compound expressed as $R^2{}_n SiX_{4-n}$. Particularly, a compound including fluorine atoms such as a compound whose $R^1$ or $R^2$ is $C_n F_{2n+1} C_n H_{2m}$ has low affinity for other materials, and therefore is preferable as a material of self-assembled monolayers forming the second region. A compound having a mercapto group or —COOH has high affinity for other materials, and thus is preferable as the material of self-assembled monolayers forming the first region.

In order to solve the above discussed and/or other problems, a method of manufacturing a ferroelectric device of exemplary embodiments of the present invention is a method of manufacturing a ferroelectric device, which manufactures a ferroelectric device including a ferroelectric layer of a given planar shape formed on a substrate. The method includes forming a lower electrode composed of strontium ruthenate on the substrate; forming, on the lower electrode, a first region having high affinity for a ferroelectric material used to form the ferroelectric layer, and a second region whose affinity for the ferroelectric material is lower than the affinity of the first region; and forming the ferroelectric layer of the given planar shape by supplying the ferroelectric material onto the lower electrode so as to dispose the ferroelectric material on the first region.

According to exemplary embodiments of the invention, the lower electrode is formed of strontium ruthenate and the ferroelectric layer of a given planar shape is formed on the first region on the lower electrode selectively. Thus, the ferroelectric layer of a desired planar shape having high crystallinity in which crystal orientation is aligned to a desired direction, can be obtained. Moreover, forming the lower electrode by strontium ruthenate enables the adhesiveness between the lower electrode and the ferroelectric layer to be enhanced, and enables the material constituting the ferroelectric layer to be reduced or prevented from diffusing into the lower electrode. Therefore, the ferroelectric device having good electrical characteristic and high reliability can be obtained.

In the method of manufacturing a piezoelectric device of exemplary embodiments of the present invention, the lower electrode is formed into (001)-orientation or (111)-orientation.

According to exemplary embodiments of this invention, by forming the lower electrode into (001)-orientation or (111)-orientation, the ferroelectric layer on the lower electrode can be formed into (001)-orientation or (111)-orientation.

In a material having high dielectric constant, stress may be caused when voltage is applied. However, forming into these orientations enables the generation of stress to be reduced.

The method of manufacturing a ferroelectric device of exemplary embodiments of the present invention can utilize the above method of manufacturing a piezoelectric device. For example, in a piezoelectric device, a piezoelectric layer is formed after an insulating layer and a buffer layer are formed on a substrate. Also in the fabrication of a ferroelectric device, after these layers are formed, a ferroelectric layer can be formed thereon. In forming a ferroelectric layer, a ferroelectric material can be supplied as a mist, and a ferroelectric material can be deposited by CVD. At this time, an ion beam assisted method can also be used. Furthermore, the first and second regions can be formed by using a surface modification film such as self-assembled monolayers.

The droplet ejection head of exemplary embodiments of the present invention includes a piezoelectric device manufactured by any of the above exemplary methods of manufacturing a piezoelectric device. According to exemplary embodiments of this invention, the droplet ejection head includes a high-performance piezoelectric device that is easily manufactured at low cost can be provided.

The electronic equipment of exemplary embodiments of the present invention includes a piezoelectric device manufactured by any of the above exemplary methods of manufacturing a piezoelectric device, or a ferroelectric device manufactured by any of the above exemplary methods of manufacturing a ferroelectric device. According to exemplary embodiments of this invention, the electronic equipment having a piezoelectric device or a ferroelectric device that is easily manufactured at low cost and is superior in characteristics, can be provided.

DETAILED DESCRIPTION OF PREFERRED EMBODIMENTS

A method of manufacturing a piezoelectric device and a ferroelectric device, a droplet ejection head, and electronic equipment according to exemplary embodiments of the present invention will be described in detail below with reference to the drawings. Although a method of manufacturing a piezoelectric device will be described mainly in the following exemplary embodiment, it should be noted that a ferroelectric device is also fabricated by the same or similar manufacturing method as that of a piezoelectric device.

A method of manufacturing a piezoelectric device according to exemplary embodiments of the present invention includes forming, an insulating layer and a Suffer layer on a substrate in sequence. Thereafter, a process of forming a lower electrode composed of strontium ruthenate (SRO) is implemented. Next, in order to form a piezoelectric layer having a given planar shape, a process of forming a plurality of regions whose wettability with respect to a piezoelectric material and so forth is different from each other on the surface of the lower electrode, is implemented. Specifically, a first region that has high affinity for a piezoelectric material, and a second region whose affinity for the piezoelectric material is lower than that of the first region, are formed.

Subsequently, a process of forming a piezoelectric layer having a given planar shape is implemented. In this process, by utilizing the differences in deposition speed of the piezoelectric material and in adhesiveness with the lower electrode between the regions that are caused by the difference in affinity between the first and second regions, the piezoelectric material is selectively grown. Thereafter, a process of forming an upper electrode on the piezoelectric layer is implemented, and thereby a piezoelectric device having a structure in which the piezoelectric layer, the upper electrode, and the lower electrode that are disposed in a manner of sandwiching the piezoelectric layer are included, is manufactured. Exemplary embodiments of the method of manufacturing a piezoelectric device of the present invention will be described below.

First Exemplary Embodiment

Figure 1A:
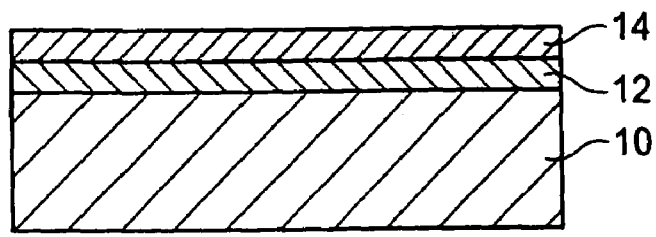
FIGS. 1A through 1D are schematics showing a method of manufacturing a piezoelectric device according to a first exemplary embodiment of the present invention.

FIGS. 1A–1D are schematics showing a method of manufacturing a piezoelectric device according to a first exemplary embodiment of the present invention In the present exemplary embodiment, first, as shown in FIG. 1A, a process of forming an insulating layer 12 and a buffer layer 14 on a substrate 10 is implemented. The substrate 10 is a (110)-oriented silicon single crystal wafer of diameter of 100 millimeters and thickness of 200 micrometers, for example. The insulating layer 12 is formed by disposing the substrate 10 in a furnace whose temperature is set to about 1100 degrees centigrade and flowing dry oxygen so as to carry out thermal oxidation for about 22 hours. The insulating layer 12 is composed of silicon dioxide ($SiO_2$) and is formed by about 1 micrometers of film thickness.

The insulating layer 12 may be formed by using a film forming method such as CVD (Chemical Vapor Deposition) besides the thermal oxidation. The insulating layer 12 may be formed of, besides silicon dioxide, any of zirconium dioxide ($ZrO_2$), cerium dioxide ($CeO_2$), yttria stabilized zirconia (YSZ), and $Ga_2Zr_2O_7$. Otherwise, it may be formed into a structure in which at least two of these materials are stacked (for example, a stacked structure of cerium dioxide and yttria stabilized zirconia).

After the insulating layer 12 is formed on the substrate 10, a process of forming the buffer layer 14 composed of strontium oxide (SrO) is implemented. The buffer layer 14 is formed in order to enhance the orientation of a lower electrode to be formed later, and is formed by using laser ablation accompanied with ion beam irradiation, for example. First, the substrate 10 on which the insulating layer 12 is formed, is loaded on a substrate holder (not shown) so as to be disposed in vacuum equipment. In this vacuum equipment, a target for buffer layer including an element for forming the buffer layer 14, is disposed in a manner facing the substrate 10 with a given interval. As described later in detail, besides the target for buffer layer, a target for lower electrode including an element of a lower electrode 16 is also disposed with a given interval in this vacuum equipment.

Then, when the target for buffer layer is irradiated with laser light for example, atoms including oxygen atoms and metal atoms are sputtered out from the target for buffer layer to generate plumes, and the plumes are brought into contact with the insulating layer 12 (substrate 10). In addition, almost simultaneously with this, an ion beam is radiated to the surface of the insulating layer 12 in an inclined manner by a given angle. Thereby, the buffer layer 14 that orients along both directions perpendicular and parallel to the surface (in-plane orientation) is formed on the insulating layer 12.

As a method of sputtering the atoms out from the target for buffer layer, besides the method of radiating laser light to the surface of the target for buffer layer, a method of radiating argon gas (inert gas) plasma, electron beam, and so forth to the surface of the target for buffer layer, may be used for example. The radiation angle of the ion beam with respect to the surface of the insulating layer 12 is preferably about 42–47 degrees, though it is not limited particularly. By radiating an ion beam to the surface of the insulating layer 12 with such a radiation angle, the buffer layer 14 that is cubic-(100)-oriented and is in-plane oriented (biaxially oriented), can be formed.

The film thickness of strontium oxide is preferably thin, in order to ensure adhesiveness at the interface, and since strontium oxide has deliquescence. Therefore, the thickness of the buffer layer 14 is set to 10 nanometers or less, for example. The buffer layer 14 may be formed of, besides strontium oxide, any of magnesium oxide (MgO), calcium oxide (CaO), barium oxide (BaO), bismuth titanate ($Bi_4Ti_3O_{12}$), and a chemical compound having a layered perovskite structure. As a compound having a layered perovskite structure, for example, YBCO ($YBa_2Cu_3O_{7-x}$) is listed. The buffer 14 may be formed not only by laser ablation but by publicly known PVD (Physical Vapor Deposition) such as sputtering.

Figure 1B:
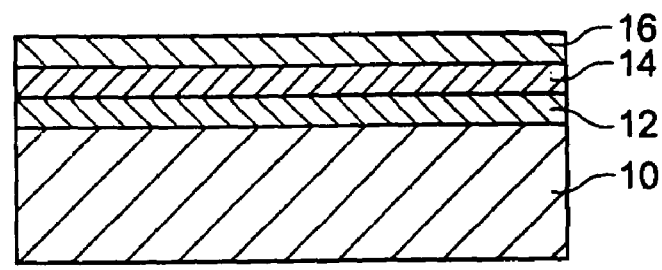

After the insulating layer 12 and the buffer layer 14 are formed, a process of forming the lower electrode 16 on the buffer layer 14 is implemented as shown in FIG. 1B. The lower electrode 16 is one of electrodes for applying voltage to a piezoelectric layer formed on the lower electrode 16, and is formed so as to function as an electrode common to a plurality of piezoelectric layers formed above the substrate 10. The lower electrode 16 is made up of (100)-oriented strontium ruthenate (SRO). SRO assumes perovskite structure, and is expressed as $Sr_{n+1}Ru_nO_{3n+1}$ (n is an integer number equal to or more than 1). The formula becomes $Sr_2RuO_4$ when n=1, the formula becomes $Sr_3Ru_2O_7$ when n=2, and the formula becomes $SrRuO_3$ when n=∞. In the present exemplary embodiment, $SrRuO_3$ is most preferable in order to enhance the electrical conductivity and the crystallinity of a piezoelectric layer.

The lower electrode 16 is formed by using the vacuum equipment used when forming the buffer layer 14, through laser ablation, for example. When the lower electrode 16 is formed, laser light is radiated to a target for lower electrode provided in the vacuum equipment so as to generate plumes of atoms including oxygen atoms and various metal atoms. Then, these plumes are brought into contact with the surface (upper surface) of the buffer layer 14 so as to epitaxially grow metal oxide having a perovskite structure on the buffer layer 14. If necessary, in the same or similar way as the case of forming the buffer layer 14, the lower electrode 16 may be formed while ion beam is radiated thereto. This enables the lower electrode 16 to be formed more effectively.

As for various conditions for forming the lower electrode 16, it is sufficient that the conditions are such that various metal atoms reach the buffer layer 14 with a given ratio (namely, composition ratio of metal oxide having a perovskite structure), and the lower electrode 16 can be epitaxially grown. Although laser ablation is preferably used in order to enhance the crystallinity of the lower electrode 16, the lower electrode 16 can also be formed by methods such as MOCVD and sputtering.

Figure 1C:
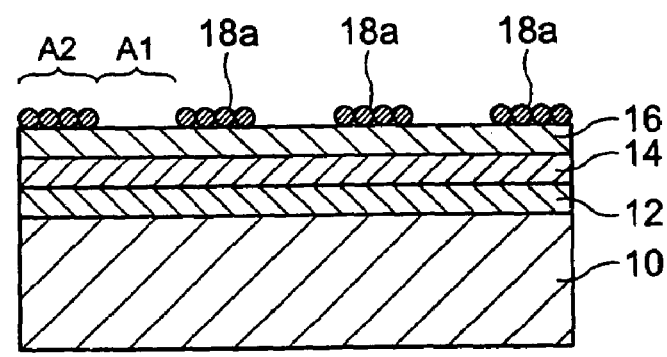

Upon completion of forming the lower electrode 16, as shown in FIG. 1C, self-assembled monolayers 18a as a surface modification film are formed partially on the surface of the lower electrode 16. Thus, low affinity regions (second regions) A2 whose affinity for a piezoelectric material is lower than that of the surface of the lower electrode 16, are formed. Therefore, the surface of the lower electrode 16 other than the forming region of the self-assembled monolayers 18a becomes high affinity regions (first region) A1 having relatively high affinity for the piezoelectric material.

The self-assembled monolayers are formed through the following method, for example. First, the surface of the lower electrode 16 is cleaned. Then, the lower electrode 16 is dipped into an ethanol solution of thiol whose concentration is from several µmol/l to several dozen µmol/l for given time so as to form self-assembled monolayers. Thereafter, the surface of the lower electrode 16 is cleaned with ethanol and pure water in this order. If necessary, the surface of the lower electrode 16 is dried in nitrogen atmosphere. Through the above processes, self-assembled monolayers are formed on the whole surface of the lower electrode 16. Next, by pattern-forming the self-assembled monolayers 18$a$, whose affinity for a piezoelectric material is lower than that of the lower electrode 16, on the whole part to become the low affinity regions A2 on the surface of the lower electrode 16, the low affinity regions A2 of a desired pattern are formed. The self-assembled monolayers 18$a$ can reduce or prevent a piezoelectric material to be supplied onto the substrate in the subsequent processes from adhering to the substrate.

The self-assembled monolayers 18$a$ include bonding functional groups that can react with atoms constituting the lower electrode 16 and normal chain molecules other than the bonding functional groups, and are a film in which a compound having, an extremely high orientation due to the interaction of the normal chain molecules, is formed. Since the film is formed by orientating single molecules, the film can be extremely thinned and can be uniform at the molecular level. According to such a structure, the same molecules are arranged on the film surface such that the surface of the lower electrode 16 can be endowed with uniform and excellent selectivity.

The self-assembled monolayers 18$a$ having such a characteristic can be formed by using a silane coupling agent (organic silicon compound) and a thiol compound. The thiol compound is a generic term for an organic compound ($R^1$—SH) having a mercapto group (—SH). The silane coupling agent is a compound expressed as $R^2{}_n SiX_{4-n}$. Particularly, a compound including fluorine atoms such as a compound whose $R^1$ or $R^2$ is $CnF_{2n+1}C_mH_{2m}$ has low affinity for other materials, and therefore is preferable as a material for forming a low affinity region.

Figure 1D:
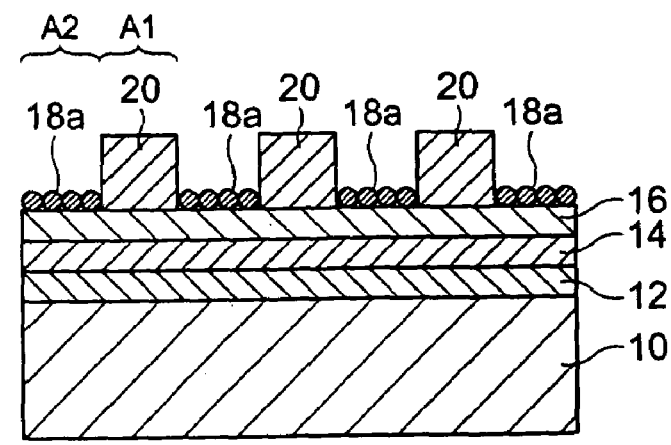

Next, as shown in FIG. 1D, a process of forming piezoelectric layers 20 by depositing a piezoelectric material on parts of the surface of the lower electrode 16 other than the low affinity regions A2 composed of the self-assembled monolayers 18$a$ (namely, on high affinity regions A1). In the present exemplary embodiment, absolution of the material including a substance constituting the piezoelectric layers 20, is turned into a mist so as to be supplied onto the lower electrode 16. Thereby, the piezoelectric material (solution) is selectively adhered onto the high affinity regions A1 so as to form the piezoelectric layers 20. In order to supply a solution as a mist, for example, an injection method, in which liquid is injected and is made to impact on a wall, and then the dispersed mist is carried by a carrier gas, and a method in which a mist dispersed by ultra sonic is carried, can be applied. As the above solution, in the case of forming the piezoelectric layers 20 composed of lead zirconate titanate (Pb(Zr, Ti)$O_3$:PZT) for example, a solution obtained by solving PZT in a acetic acid solvent can be used.

This acetic acid solvent can be prepared in the following exemplary method. First, lead acetate trihydrate (Pb(CH$_3$COO)$_2$·3H$_2$O), zirconium acetylacetonate (Zr(CH$_3$COCHCOCH$_3$)$_4$), and magnesium acetate trihydrate (Mg(CH$_3$COO)$_2$·3H$_2$O) are stirred in an acetic acid as a solvent. Initially, the solvent is stirred at room temperature, then stirred in atmosphere at about 100 degrees centigrade for 10–20 minutes, and thereafter cooled at room temperature. Next, titanium tetraisopropoxide (Ti(O-i-C$_3$H$_7$)$_4$) and pentaethoxy niobium (Nb(OC$_2$H$_5$)$_5$) are added and stirred.

Moreover, butoxyethanol (C$_4$H$_9$OC$_2$H$_4$OH) is added and stirred at room temperature for about 5 minutes. 3%-hydrochloric acid alcohol is added and stirred at room temperature for about 5 minutes. Moreover, acetylacetone (CH$_3$COCH$_2$COCH$_3$) is added and stirred at room temperature for about 60 minutes. Finally, polyethyleneglycol (HO(C$_2$H$_4$)$_n$H) is added and stirred at room temperature for about 5 minutes. The acetic acid solvent is completed through the above processes. However, the solvent and so forth is not limited thereto.

The above acetic acid solvent is turned into a mist so as to be provided on the lower electrode 16. Then, the acetic acid solvent applied on the lower electrode 16 receives the action (force) of being expelled from the self-assembled monolayers 18$a$ so as to be collected on parts other than the low affinity regions A2, or receives the action (force) of being prevented from running out of parts other than the low affinity regions A2. Therefore, even if the acetic acid solvent (piezoelectric material) is provided on the whole surface of the lower electrode 16, and even if the acetic acid solvent is provided to parts other than the low affinity regions A2, the solvent is accurately applied on the whole parts (high affinity regions A1) other than the low affinity regions A2. Since the acetic acid solvent is provided as a mist that includes droplets of sub micron order, even if piezoelectric layers formed on the first regions are minute, the piezoelectric layers can easily be formed with extremely high accuracy.

After the acetic acid solvent (solution of a piezoelectric material) is adhered onto the lower electrode 16, the solvent is dried at certain temperature (for example, 180 degrees centigrade) for certain time (for example, about 10 minutes). This drying process allows butoxyethanol, which is a solvent, to be evaporated. After drying, degreasing is further implemented in the atmosphere at given high temperature (for example, 400 degrees centigrade) for certain time. The degreasing allows organic ligands coordinated to a metal to be thermally decomposed, and the metal is oxidized so as to become metal oxide. The processes of adhering, drying, and degreasing are repeated in this order the given number of times, for example, 8 times, so as to deposit ceramics layers of 8 layers. Through these drying and degreasing processes, metal alkoxides in the solution are hydrolyzed and polycondensated so as to form metal-oxygen-metal network.

When repeating the processes of adhering, drying, and degreasing, heat treatment for promoting the crystallization of the piezoelectric layers 20 and enhancing the piezoelectric characteristic may be implemented after layers of given number are deposited. For example, in the case of forming the piezoelectric layers 20 in which 8 layers are deposited, rapid thermal annealing (RTA) of 600 degrees centigrade for 5 minutes and 725 degrees centigrade for 1 minute is implemented in oxygen atmosphere after 4 layers are deposited. Furthermore, after 8 layers are deposited, RTA of 650 degrees centigrade for 5 minutes and 900 degrees centigrade for 1 minute is implemented in oxygen atmosphere. Such heat treatment enables amorphous phases included in the piezoelectric layers 20 to be crystallized.

Through the above processes, the piezoelectric layers 20 having the thickness of about 1–2 micrometers can be formed selectively on the lower electrode 16. The crystal of the piezoelectric layers 20 grows while being affected by the crystal structure of the lower electrode 16 composed of SRO. In the present exemplary embodiment, the piezoelectric layers 20 are formed on the lower electrode 16, that is (100)-oriented. Therefore, the piezoelectric layers 20 can be formed in (100)-orientation in which voltage displacement amount (deformation amount with respect to applied voltage) is large. Moreover, in the present exemplary embodiment, since the piezoelectric layers 20 are formed on the lower electrode 16 composed of SRO, the piezoelectric layers 20 having high crystallinity whose crystal orientation is aligned can be formed. Furthermore, both of SRO constituting the lower electrode 16 and PZT constituting the piezoelectric layers 20, have perovskite crystal structure. Thus, adhesiveness between the lower electrode 16 and the piezoelectric layers 20 can be enhanced, while a material of the piezoelectric layers 20 (for example, Pb) can be reduced or prevented from diffusing into the lower electrode 16. Therefore, the electric characteristic is good, and reliability can be enhanced. In addition, in the present exemplary embodiment, the piezoelectric layers 20 are formed without implementing etching process such that the piezoelectric layers 20 of a given shape can be formed extremely easily.

Although the case in which the acetic acid solvent is applied onto the lower electrode 16 as a mist has been explained in the above exemplary embodiment, a method of applying liquid onto the lower electrode 16 directly, such as spin coating and dipping, or a droplet ejection method in which liquid is ejected from an ink jet nozzle and so forth so as to be supplied onto the lower electrode 16 directly, can be used as methods of supplying the acetic acid solvent onto the lower electrode 16. For the supply of the piezoelectric material on the lower electrode 16, gas phase methods such as PVD and CVD can be used. If a gas phase method is used, a gas or plasma of a material constituting the piezoelectric layers 20 is supplied and deposited onto the lower electrode 16, and thereby the piezoelectric layers 20 are formed on the high affinity regions A1 selectively.

The specific composition of the piezoelectric layers 20 is, though not limited particularly, preferably any of, besides PZT, lead lanthanum titanate ((Pb, La)TiO$_3$), lead lanthanum zirconate ((Pb, La)ZrO$_3$:PLZT), lead magnesium niobate-lead titanate (Pb(Mg, Nb)TiO$_3$:PMN-PT), lead magnesium niobate-lead zirconate titanate (Pb(Mg, Nb)(Zr, Ti)O$_3$: PMN-PZT), lead zinc niobate-lead titanate (Pb(Zn, Nb)TiO$_3$:PZN-PT), lead scandium niobate-lead titanate (Pb(Sc, Nb)TiO$_3$:PSN-PT), lead nickel niobate-lead titanate (Pb(Ni, Nb)TiO$_3$:PNN-PT), (Ba$_{1-x}$Sr$_x$)TiO$_3$(0≦x≦0.3), Bi$_4$Ti$_3$O$_{12}$, SrBi$_2$Ta$_2$O$_9$, LiNbO$_3$, LiTaO$_3$, and KNbO$_3$. For example, in the case of lead magnesium niobate-lead zirconate titanate, the composition of Pb(Mg$_{1/3}$Nb$_{2/3}$)$_{0.1}$Zr$_{0.504}$Ti$_{0.396}$I$_3$ is preferable.

After the piezoelectric layers 20 are formed, a process of forming upper electrodes (not shown) on the piezoelectric layers 20 is implemented. This upper electrode is the other of electrodes for applying voltage to the piezoelectric layers 20, and is composed of an electrically conductive material, for example, platinum (Pt), iridium (Ir), and aluminum (Al). In the case of using aluminum, iridium and so forth is further deposited in order to prevent electric corrosion. Through the above processes, a piezoelectric device having a structure in which the piezoelectric layer, the upper electrode, and the lower electrode that are disposed in a manner of sandwiching the piezoelectric layer are included, is manufactured.

(Second Exemplary Embodiment)

Figure 2A:
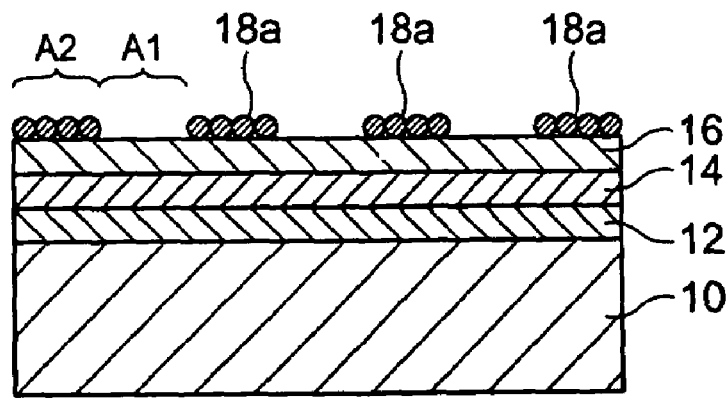
FIGS. 2A through 2C are schematics showing a method of manufacturing a piezoelectric device according to a second exemplary embodiment of the present invention.
Figure 2B:
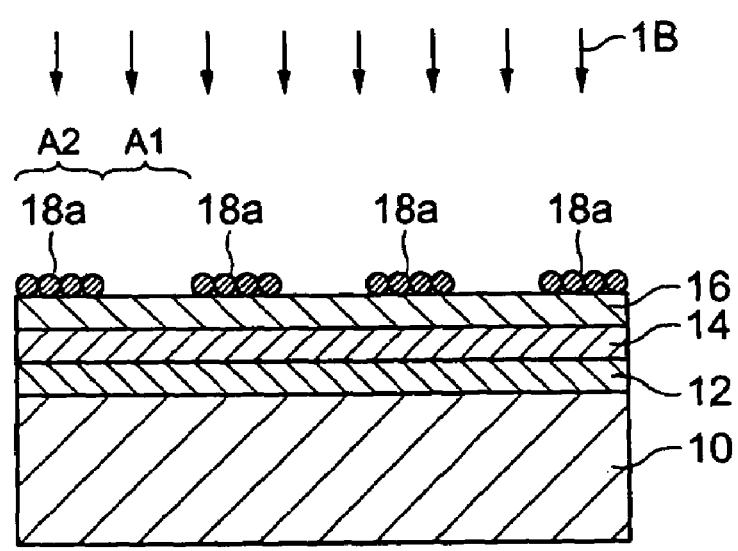
Figure 2C:
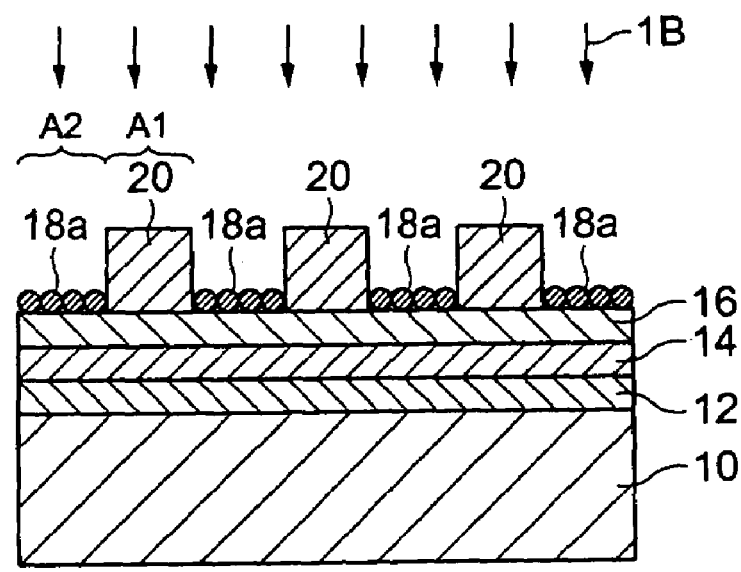

FIGS. 2A–C are schematics showing a method of manufacturing a piezoelectric device according to a second exemplary embodiment of the present invention.

As shown in FIG. 2A, also in the present exemplary embodiment, in the same way as that of the first exemplary embodiment, the insulating layer 12, the buffer layer 14, and the lower electrode 16 are formed on the substrate 10 in sequence, and then the self-assembled monolayers 18a are formed on given regions on the lower electrode 16. Thereby, the high affinity regions (first regions) A1 and the low affinity regions (second regions) A2 are formed.

Next, at the same time that a solution of a material including the substance of the piezoelectric layers 20 is supplied onto the lower electrode 16 as a mist, an ion beam IB is radiated to the lower electrode 16 as shown in FIG. 2B, so as to start the forming of the piezoelectric layers 20 by an ion beam assisted method. In the present exemplary embodiment, as shown in FIG. 2C, the ion beam IB continues to be radiated to the lower electrode 16 always while a solution is supplied onto the lower electrode 16 as a mist so as to form the piezoelectric layers 20. By forming the piezoelectric layers 20 by using an ion beam assisted method, layers with aligned orientation direction can be obtained since the orientation of the piezoelectric layers 20 can be controlled. Furthermore, the piezoelectric layers 20 having a higher characteristic can be formed since the process temperature can be lowered.

Although the case in which a solution of a material including the substance of the piezoelectric layers 20 is supplied onto the lower electrode 16 as a mist has been explained in the above explanation, the ion beam assisted method can be used also in the case in which a gas or plasma of a material of the piezoelectric layer s 20 is supplied and deposited onto the lower electrode 16 by using laser deposition, sputtering, CVD, and so forth. In the present exemplary embodiment, platinum (Pt) can also be used as a material of the lower electrode 16 since the orientation of the piezoelectric layers 20 can be controlled by radiation of the ion beam IB. However, it is preferable that the lower electrode 16 is formed using SRO as with the first exemplary embodiment in view of crystallinity and so forth.

(Third Exemplary Embodiment)

Figure 3A:
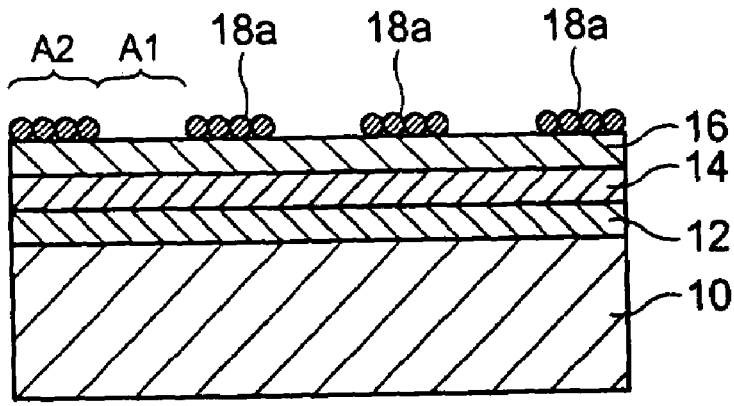
FIGS. 3A through 3C are schematics showing a method of manufacturing a piezoelectric device according to a third exemplary embodiment of the present invention.
Figure 3B:
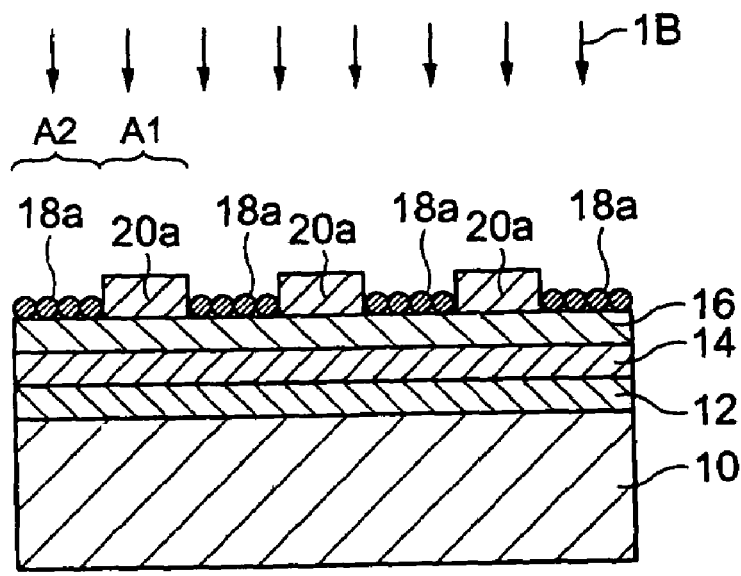
Figure 3C:
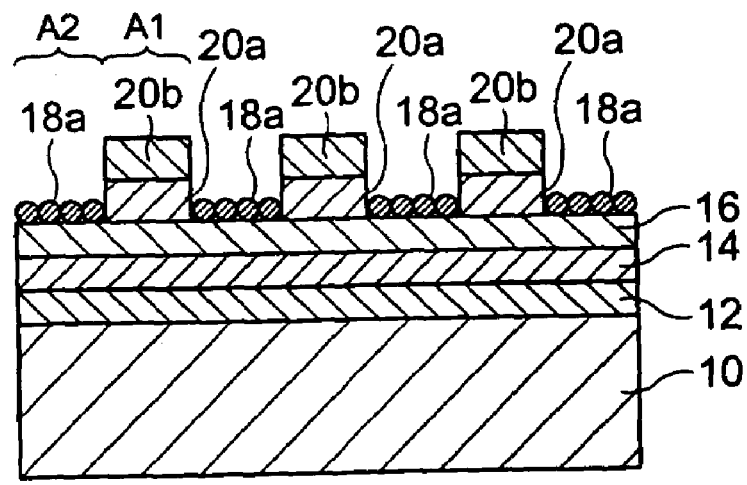

FIGS. 3A–C are schematics showing a method of manufacturing a piezoelectric device according to a third exemplary embodiment of the present invention.

As shown in FIG. 3A, also in the present exemplary embodiment, in the same way as that of the first exemplary embodiment, the insulating layer 12, the buffer layer 14, and the lower electrode 16 are formed on the substrate 10 in sequence, and then the self-assembled monolayers 18a are formed on given regions on the lower electrode 16. Thereby, the high affinity regions (first regions) A1 and the low affinity regions (second regions) A2 are formed.

Next, as with the second exemplary embodiment, at the same time that a solution of a material including the substance of the piezoelectric layers is supplied onto the lower electrode 16 as a mist, the ion beam IB is radiated to the lower electrode 16, so as to start the forming of the piezoelectric layers by an ion beam assisted method. In the present exemplary embodiment, first layers 20a are formed by the ion beam assisted method as shown in FIG. 3B. Then, as shown in FIG. 3C, with stopping the radiation of the ion beam IB, the supply of a mist is continued so as to form second layers 20b.

As above, in the present exemplary embodiment, piezoelectric layers made up of the first layers 20a and the second layers 20b are formed. The crystal of the second layers 20b formed while the radiation of the ion beam IB is stopped, grows while being affected by the first layers 20a that is in-plane oriented, and thus the second layers 20b become layers with good orientation. Therefore, a film with good orientation can be formed at low cost while energy consumed for generating an ion beam is suppressed. Furthermore, in depositing with stopping ion beam assist, the deposited thin film is not etched by the ion beam, and therefore an advantage that time required for forming piezoelectric layers can be shortened, is achieved in the present exemplary embodiment.

The present exemplary embodiment is also applicable to the case in which a gas or plasma of a material constituting piezoelectric layers is supplied and deposited onto the lower electrode 16 by using laser deposition, sputtering, and CVD. In the present exemplary embodiment, platinum (Pt) can also be used as a material of the lower electrode 16 since the orientation of piezoelectric layers at forming start time can be controlled by radiation of the ion beam IB. However, it is preferable that the lower electrode 16 is formed using SRO as with the first exemplary embodiment in view of crystallinity and so forth. Although the case in which the second layers 20b are formed on the first layers 20a is exemplified in the above explanation, in-plane oriented layers formed by the ion beam assisted method may further be provided on the first and second layers by repeating implementation and halt of ion beam assist a plurality of times. Furthermore, a layer deposited stopping ion beam assist, may further be provided thereon. Moreover, the repletion of the same layers as the above layers may further be provided thereon.

(Fourth Exemplary Embodiment)

Figure 4A:
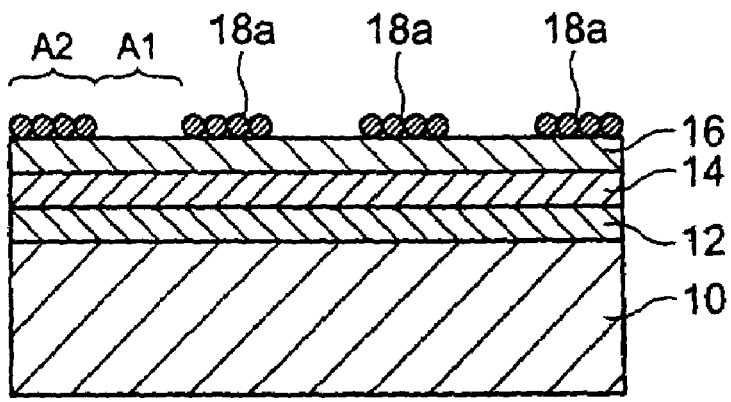
FIGS. 4A through 4C are schematics showing a method of manufacturing a piezoelectric device according to a fourth exemplary embodiment of the present invention.
Figure 4B:
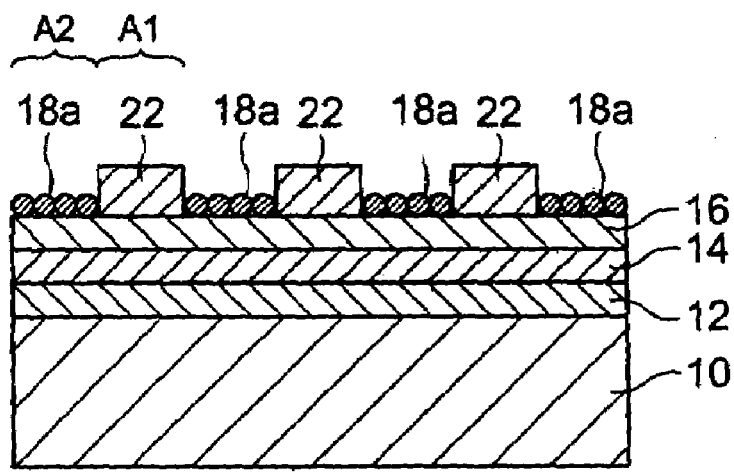
Figure 4C:
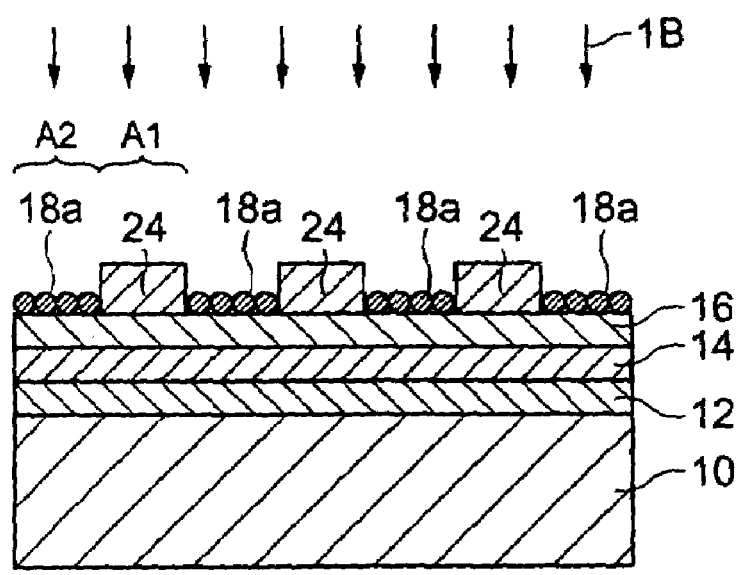

FIGS. 4A–C are schematics showing a method of manufacturing a piezoelectric device according to a fourth exemplary embodiment of the present invention.

As shown in FIG. 4A, also in the present exemplary embodiment, in the same way as that of the first exemplary embodiment, the insulating layer 12, the buffer layer 14, and the lower electrode 16 are formed on the substrate 10 in sequence, and then the self-assembled monolayers 18a are formed on given regions on the lower electrode 16. Thereby, the high affinity regions (first regions) A1 and the low affinity regions (second regions) A2 are formed.

Next, a solution of the material including a substance constituting the piezoelectric layers, is turned into a mist so as to be supplied onto the lower electrode 16. Thereby, as shown in FIG. 4B, precursors 22 of the piezoelectric layers are formed. Then, drying is carried out at certain temperature for a certain period so as to evaporate the solvent of the solution supplied onto the lower electrode 16. The drying temperature is preferably 150–200 degrees centigrade. The drying time is preferably 5–15 minutes. After drying, degreasing is further carried out in the atmosphere at certain high temperatures for a certain period. Thus, organic ligands coordinated to metals are thermally decomposed so as to form metal oxide.

The degreasing temperature is preferably 300–500 degrees centigrade. The degreasing time is preferably 5–90 minutes. If the degreasing temperature is set relatively high, a number of fine crystal grains are easy to be generated in the precursors 22. These processes of supplying, drying, and degreasing of the solution are repeated the given number of times, for example twice, so as to deposit the precursors 22 that are made up of two layers. By these drying and degreasing treatment, the metal alkoxides and acetates in the solution form the network of metal-oxygen-metal through thermal decomposition of ligands.

After degreasing, as shown in FIG. 4C, the ion beam IB is radiated to the precursors 22 from a certain angle so as to form piezoelectric layers 24. The radiation of the ion beam IB enables the atoms in the precursors 22 to be aligned in a given arrangement such that the piezoelectric layers 24 with good orientation can be obtained. Although the principle that the arrangement of atoms can be controlled by the radiation of the ion beam IB is not necessarily clear, it is speculated that the radiation of an ion beam from a certain angle allows some metal atoms to be sputtered out from the precursors 22 and allows some metal atoms to be thrust behind other metal atoms, and thereby aligning the metal atoms in a given arrangement.

When radiating an ion beam, the substrate 10 on which the precursors 22 are formed on the lower electrode 16 is loaded on a substrate holder so as to be disposed in vacuum equipment. In this vacuum equipment, a Kauffman ion source and so forth is provided for example, and therefore an ion beam can be radiated to a given position in the vacuum equipment. As the ion beam, although there is no limitation particularly, at least one kind of ion out of inert gas such as argon, helium, neon, xenon, and krypton, or a mixture ion of these ions and an oxygen ion are named, for example.

The radiation angle of the ion beam with respect to the normal line direction of surface of the precursors 22 is, but not particularly limited thereto, preferably about 35–65 degrees. Particularly, the radiation angle is more preferably about 42–47 degrees, or about 52–57 degrees. By radiating an ion beam to the surface of the precursor films with setting such a radiation angle, the piezoelectric layers 24 that are cubic-(100)-oriented and have good in-plane orientation, can be formed.

(Fifth Exemplary Embodiment)

Figure 5A:
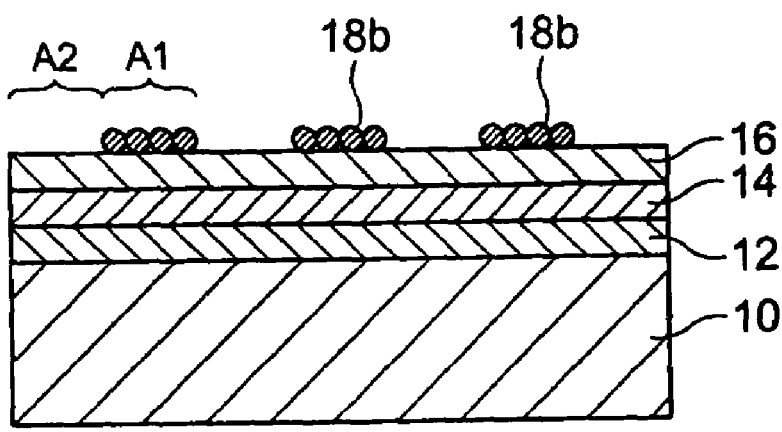
FIGS. 5A and 5B are schematics showing a method of manufacturing a piezoelectric device according to a fifth exemplary embodiment of the present invention.
Figure 5B:
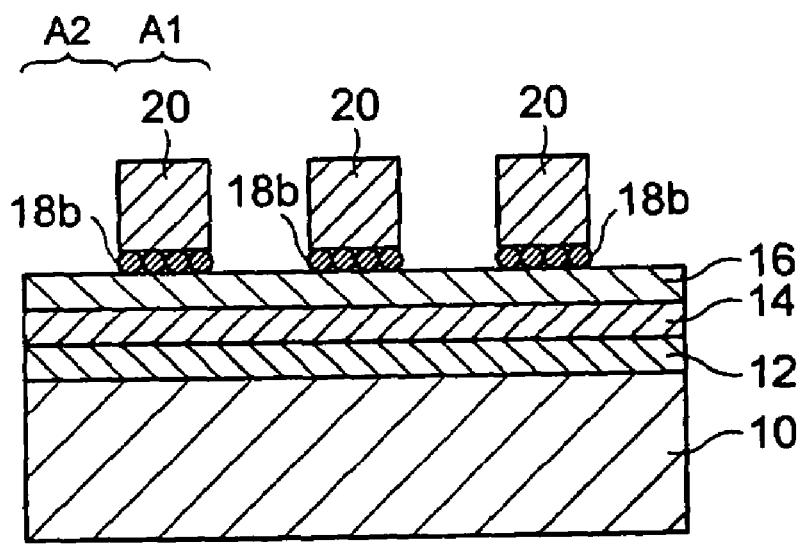

FIGS. 5A–B are schematics showing a method of manufacturing a piezoelectric device according to a fifth exemplary embodiment of the present invention.

The above second through fourth exemplary embodiments are different from the first exemplary embodiment in the forming method of piezoelectric layers on the lower electrode 16. The present exemplary embodiment is different from the first exemplary embodiment in the forming method of self-assembled monolayers. In the present exemplary embodiment, the insulating layer 12, the buffer layer 14, and the lower electrode 16 are formed on the substrate 10 in sequence first. Then, as shown in FIG. 5A, the high affinity regions A1 constituted by lyophilic self-assembled monolayers 18b as a surface modification film, are formed on the lower electrode 16. The high affinity regions A1 are preferably the same as the forming region of the piezoelectric layers 20 on the lower electrode 16. As for a forming method of the self-assembled monolayers 18b, the method described in the first exemplary embodiment can be applied thereto.

The self-assembled monolayers 18b having high affinity for the piezoelectric material, can be formed by using a silane coupling agent (organic silicon compound) and a thiol compound. The thiol compound is an organic compound ($R^1$—SH) having a mercapto group (—SH). Compounds having a mercapto group or —COOH have high affinity for other materials, and thus are preferable as the material of the self-assembled monolayers 18b to form the high affinity regions A1.

Then, as shown in FIG. 5B, the piezoelectric layers 20 are formed on the high affinity regions A1 constituted by the self-assembled monolayers 18b on the surface of the lower electrode 16. As a forming method of the piezoelectric layers 20, the same forming method as that described in the first through fourth exemplary embodiments can be used. When the piezoelectric material is supplied to the lower electrode 16, the piezoelectric material receives the action of being attracted to the self-assembled monolayers 18b, and of being expelled from parts other than the self-assembled monolayers 18b. Therefore, even when the piezoelectric material is supplied to the whole surface of the lower electrode 16, and even when the piezoelectric material is applied to the high affinity regions A1, the piezoelectric material is accurately provided on the whole of the high affinity regions A1.

Then, after the acetic acid solvent (solution of piezoelectric material) is adhered onto the lower electrode 16, the treatment described in the first through fourth exemplary embodiments is implemented for the piezoelectric material adhered on the lower electrode 16, and thereby forms the piezoelectric layers 20 selectively on the lower electrode 16. As above, also in the present exemplary embodiment, the piezoelectric layers 20 of a given planar shape can be formed on the lower electrode 16 extremely easily without implementing an etching process.

(Sixth Exemplary Embodiment)

Figure 6A:
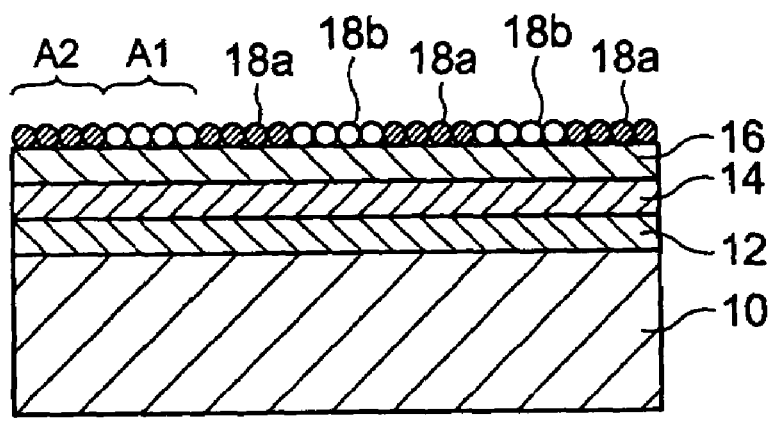
FIGS. 6A and 6B are schematics showing a method of manufacturing a piezoelectric device according to a sixth exemplary embodiment of the present invention.
Figure 6B:
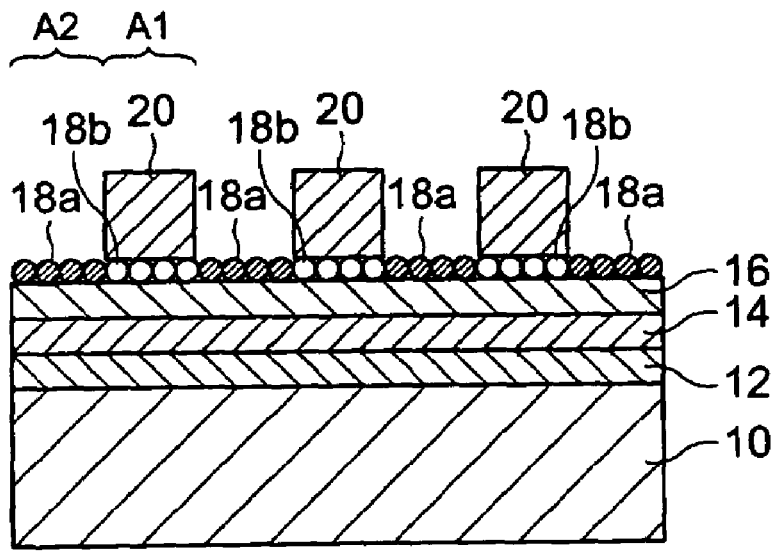

FIGS. 6A–B are schematics showing a method of manufacturing a piezoelectric device according to a sixth exemplary embodiment of the present invention.

As with the fifth exemplary embodiment, the present embodiment is also different from the first exemplary embodiment in the forming method of self-assembled monolayers. In the present exemplary embodiment, the insulating layer 12, the buffer layer 14, and the lower electrode 16 are formed on the substrate 10 in sequence first. Then, as shown in FIG. 6A, the low affinity regions A2 constituted by the self-assembled monolayers 18a having low affinity for the piezoelectric material, and the high affinity regions A1 constituted by the self-assembled monolayers 18b whose affinity for the piezoelectric material is higher than that of the self-assembled monolayers 18a, are formed on the lower electrode 16. For example, the high affinity regions A1 are the same region as the forming region of the piezoelectric layers 20 on the lower electrode 16. The low affinity regions A2 are the regions surrounding the forming region of the piezoelectric layers 20.

The low affinity regions A2 on the lower electrode 16 are preferably formed prior to the forming of the high affinity regions A1. For example, if the high affinity regions A1 (namely, the self-assembled monolayers 18b) are formed previously and thereafter the low affinity regions A2 (self-assembled monolayers 18a) are formed, the material and so forth of the low affinity regions A2 becomes easier to enter the high affinity regions A1 when forming the low affinity regions A2, such that it becomes difficult to form an accurate region pattern. On the other hand, if the low affinity regions A2 are formed previously, the low affinity regions A2 and the high affinity regions A1 having a desired pattern can be formed more easily and accurately since the material of the high affinity regions A1 is hard to enter the low affinity regions A2.

Then, as shown in FIG. 6B, the piezoelectric layers 20 are formed on the high affinity regions A1 constituted by the self-assembled monolayers 18b on the surface of the lower electrode 16. As a forming method of the piezoelectric layers 20, the same forming method as that described in the first through fourth exemplary embodiments can be used. When the piezoelectric material is supplied to the surface of the lower electrode 16, the piezoelectric material receives the action of being attracted to the self-assembled monolayers 18b, and of being expelled from the self-assembled monolayers 18a. Therefore, even when the piezoelectric material is supplied to the whole surface of the lower electrode 16, and even when the piezoelectric material is applied to the high affinity regions A1, the piezoelectric material is accurately provided on the whole of the high affinity regions A1.

Then, after the acetic acid solvent (solution of piezoelectric material) is adhered onto the lower electrode 16, the treatment described in the first through fourth exemplary embodiments is implemented for the piezoelectric material adhered on the lower electrode 16, and thereby forming the piezoelectric layers 20 selectively on the lower electrode 16. As above, also in the present exemplary embodiment, the piezoelectric layers 20 of a given planar shape can be formed on the lower electrode 16 extremely easily without implementing an etching process.

Although, in the first through sixth exemplary embodiments, the explanation has been made about the case in which the self-assembled monolayers 18a and 18b endowing a given surface characteristic, are used when forming the high affinity regions A1 and the low affinity regions A2 on the lower electrode 16, the first regions A1 and the second regions may be formed using other exemplary methods if the methods enable the piezoelectric material to be disposed on the lower electrode 16 selectively. For example, if the treatment of enhancing the affinity between the surface of the lower electrode 16 and the piezoelectric material is carried out by oxygen plasma treatment for example, and thereafter a fluorine compound is formed on given regions on the lower electrode 16 selectively, the forming region of the fluorine compound can be the low affinity regions A2 and the remaining regions can be the high affinity regions A1. Otherwise, a fluorine compound is formed on the lower electrode 16 by plasma treatment so as to reduce the affinity between the lower electrode 16 and the piezoelectric material, and thereafter the fluorine compound is partially irradiated with ultraviolet rays. Thereby, the high affinity regions A1 can be formed on desired regions on the lower electrode 16 while the remaining regions can be the low affinity regions A2.

(Forming Method of Surface Modification Film)

Next, a specific forming method of self-assembled monolayers provided on the lower electrode 16 as a surface modification film in the first through sixth exemplary embodiments of the present invention will be described.

(First Exemplary Forming Method)

Figure 7A:
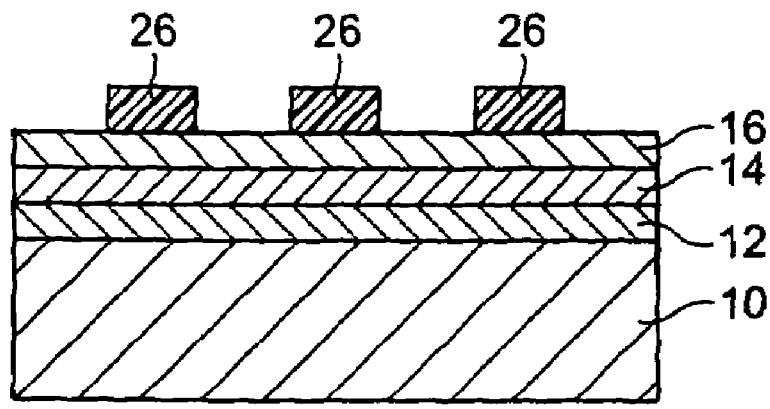
FIGS. 7A through 7C are schematic sectional views showing a first forming method of self-assembled monolayers used in the first through sixth exemplary embodiments of the present invention.
Figure 7B:
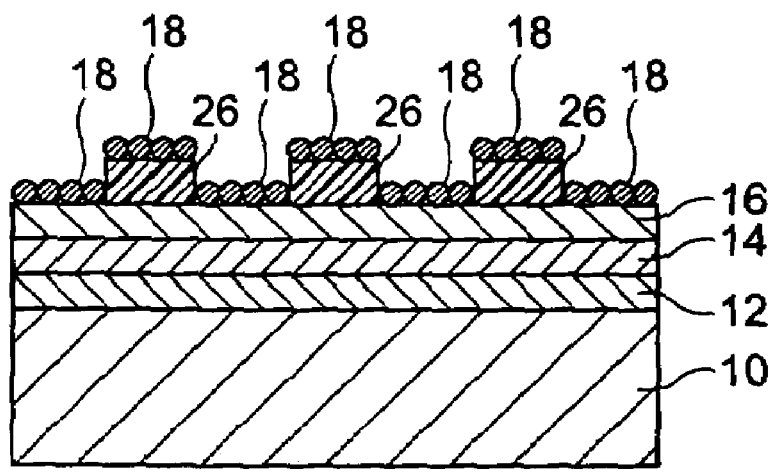
Figure 7C:
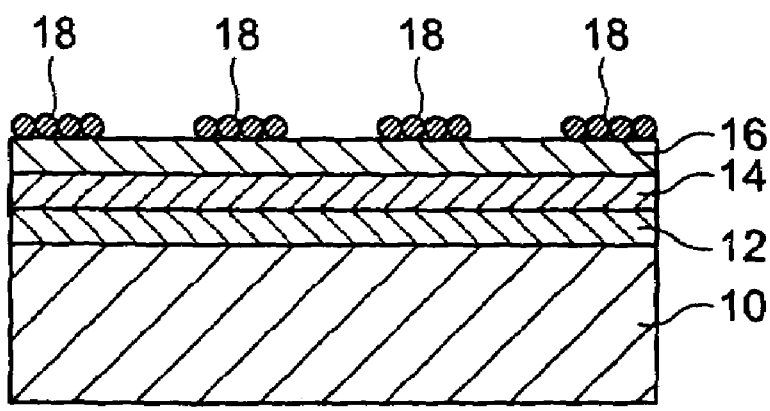

FIGS. 7A–C are schematic sectional views showing a first forming method of self-assembled monolayers used in the first through sixth exemplary embodiments of the present invention. First, as shown in FIG. 7A, a pattern of resist 26 to become a mask material is formed on the upper surface of the lower electrode 16. The pattern of the resist 26 can be formed by a lithography method in which resist is patterned with an exposure device and so forth, or a droplet ejection method in which a liquid material is ejected on desired part(s) of the lower electrode 16 from an ink jet nozzle and the like, for example. The pattern of the resist 26 is a pattern corresponding to the self-assembled monolayers 18a (second regions) shown in FIG. 1, or the self-assembled monolayers 18b (first regions) shown in FIG. 5, namely, a pattern corresponding to the forming region of the piezoelectric layers 20 or regions other than the forming region.

Then, as shown in FIG. 7B, the self-assembled monolayers 18 are deposited on the whole surface of the lower electrode 16 on which the resist 26 is formed. When forming the self-assembled monolayers 18, using a material whose affinity for the piezoelectric material is lower than that of the lower electrode 16, enables the self assembled monolayers 18a to be formed. Using a material whose affinity for the piezoelectric material is higher than that of the lower electrode 16, enables the self-assembled monolayer 18b to be formed.

The self-assembled monolayers 18 may be formed by using vapor deposition such as CVD, or may be formed by using a liquid phase method such as spin coating or dipping. If a liquid phase is used, a material disolved in liquid or a solvent is used. For example, in order to form the self-assembled monolayers 18 composed of a thiol compound by using a liquid phase, a solution of about 0.1–10 mM prepared by dissolving the thiol compound in an organic solvent such as dichloromethane and trichloromethane, can be used. Then, as shown in FIG. 7C, the resist 26 is separated from the lower electrode 16. This separation of the resist 26 allows the self-assembled monolayers 18 deposited on the resist 26 to be also separated from the lower electrode 16. Thus, the self-assembled monolayers 18 (18a and 18b) to become the first and second regions of a desired pattern, can be formed on the surface of the lower electrode 16.

(Second Exemplary Forming Method)

Figure 8A:
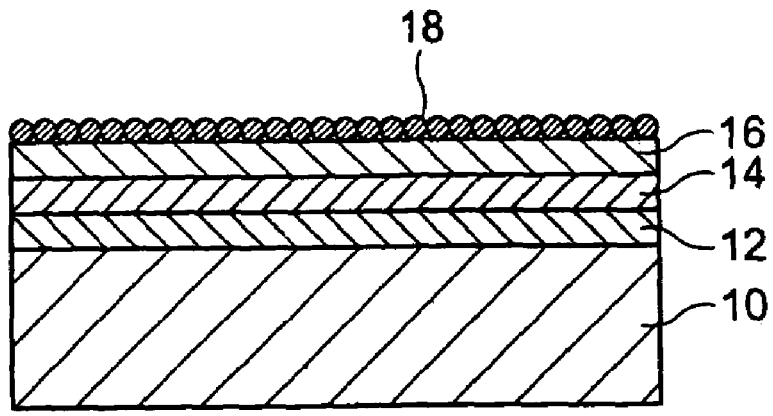
FIGS. 8A and 8B are schematic sectional views showing a second forming method of self-assembled monolayers used in the first through sixth exemplary embodiments of the present invention.
Figure 8B:
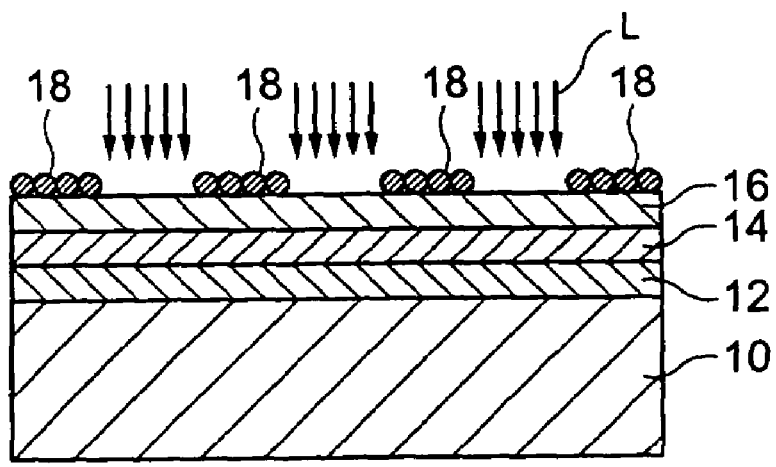

FIGS. 8A–8B are schematic sectional views showing a second forming method of self-assembled monolayers used in the first through sixth exemplary embodiments of the present invention. First, as shown in FIG. 8A, the self-assembled monolayers 18 are deposited on the whole surface of the lower electrode 16. The self-assembled monolayers 18 may be formed only on part regions of the surface of the lower electrode 16. Using a material whose affinity for the piezoelectric material is lower than that of the lower electrode 16, enables the self-assembled monolayers 18a (second regions) to be formed. Using a material whose affinity for the piezoelectric material is higher than that of the lower electrode 16, enables the self-assembled monolayers 18b (first regions) to be formed.

Then, as shown in FIG. 8B, the self-assembled monolayers 18 of unnecessary portions are directly removed by using light L. When the self-assembled monolayers 18 have lower affinity for the piezoelectric material than that of the lower electrode 16 for example, the unnecessary portion is the forming regions of the piezoelectric layer. When the self-assembled monolayers 18 have higher affinity than that of the lower electrode 16, it is a portion other than the forming regions of the piezoelectric layer. Thus, the self-assembled monolayers 18 to become the first and second regions of a desired pattern, can be formed on the surface of the lower electrode 16.

In the case of removing the self-assembled monolayers 18 partially by using the light L, the wavelength of the light is preferably 250 nanometers or less. The light whose wavelength is 250 nanometers or less has high energy and therefore can remove the self-assembled monolayers 18 regardless of the kind of the self-assembled monolayers 18. For removing the self-assembled monolayers 18 of a unnecessary portion, an electron beam or an ion beam can also be used instead of the light L. Instead of removing the self-assembled monolayers 18 with the light L, an electron beam, or an ion beam, the surface characteristic of the self-assembled monolayers 18 may be modified with the light L, an electron beam, or an ion beam. Thus, the affinity of the self-assembled monolayers 18 for the piezoelectric material can be controlled easily and accurately.

(Third Exemplary Forming Method)

Figure 9A:
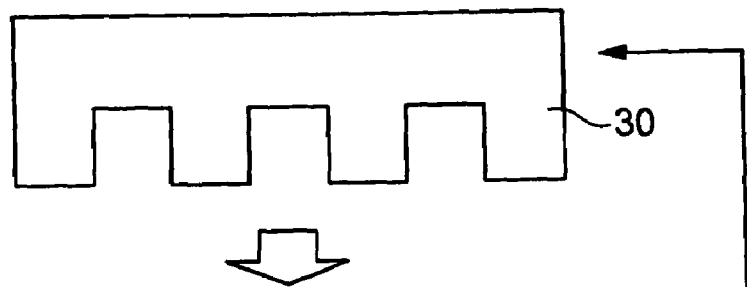
FIGS. 9A through 9D are schematic sectional views showing a third forming method of self-assembled monolayers used in the first through sixth exemplary embodiments of the present invention.

FIGS. 9A–D are schematic sectional views showing a third exemplary forming method of self-assembled monolayers used in the first through sixth exemplary embodiments of the present invention. First, as shown in FIG. 9A, a desired stamp (transfer type) 30 is fabricated. This stamp 30 can be formed of silicone rubber, polydimethylsiloxane (PDMS), or the like. The shape of convex portion of the stamp 30 is the same as the shape of the high affinity regions A1 or the low affinity regions A2. The convex portion of the stamp 30 may be formed by etching a substrate. Otherwise, the convex portion may be formed by etching a substrate so as to form an original plate having the reversed shape of the convex portion and transferring the shape of the original plate to silicone rubber, resin, or the like. In addition, a stamp for micro contact printing (μCP) may be used as the stamp 30 for example. In this case, the stamp 30 may be formed of polydimethylsiloxane (PDMS) and so forth.

Figure 9B:
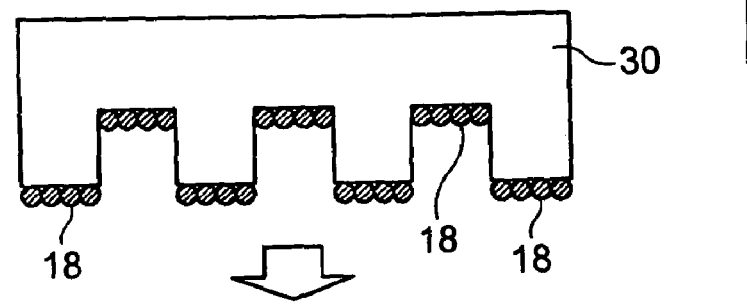

Then, as shown in FIG. 9B, the self-assembled monolayers 18 are deposited on the stamp 30. For the self-assembled monolayers 18, the different material is selected according to which of the high affinity regions A1 and the low affinity regions A2 is formed. For example, the self-assembled monolayers 18 are deposited on the stamp 30 by dipping the stamp 30 formed of polydimethylsiloxane (PDMS) and so forth, into a solution prepared by dissolving a substance constituting the self-assembled monolayers in a solvent, and thereafter drying the solution adhered to the stamp 30, and so forth.

Figure 9C:
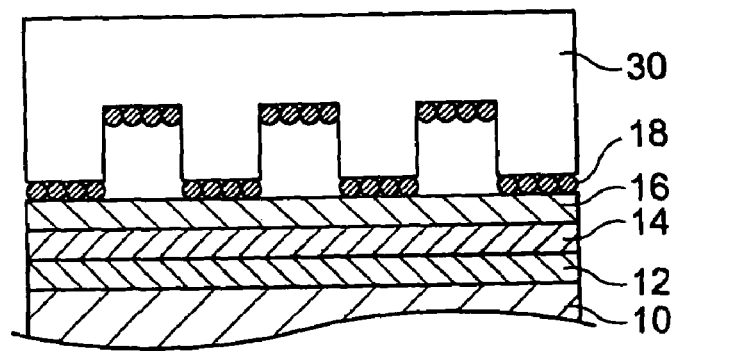
Figure 9D:
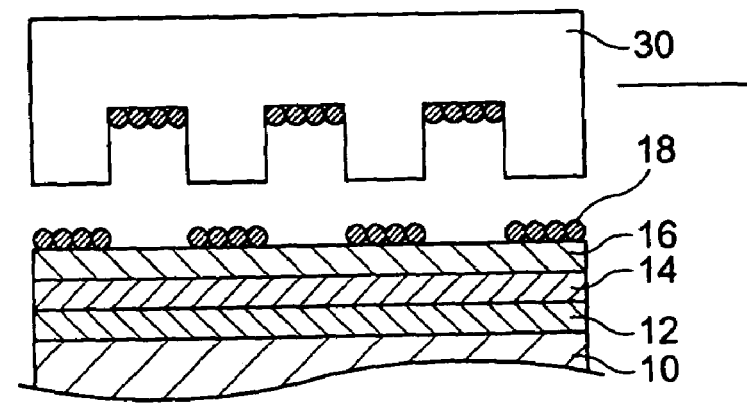

Then, as shown in FIG. 9C, the stamp 30 is pressed to a desired part on the lower electrode 16 so as to carry out micro contact printing (μCP), and thus the self-assembled monolayers 18 are transferred to the lower electrode 16. Micro contact printing is a type of relief printing, for example. Then, as shown in FIG. 9D, by separating the stamp 30 from the lower electrode 16, regions (high affinity regions A1 and low affinity regions A2) constituted by the self-assembled monolayers 18 are formed on a desired part on the lower electrode 16. Thereafter, that stamp 30 can be reused. Therefore, the processes shown in FIGS. 9A through 9D can be repeated by using one stamp 30.

In the forming method of self-assembled monolayers, the materials of the stamp 30, the self-assembled monolayers 18, and the lower electrode 16 are selected so that the adhesiveness between the surface of the stamp 30 and the self-assembled monolayers 18 is weaker than that between part of the lower electrode 16 on which the low affinity regions A2 or the high affinity regions A1 are formed, and the self-assembled monolayers 18. This enables the transferring to be carried out favorably. Furthermore, in the forming method of self-assembled monolayers, the temperature of the stamp 30, the self-assembled monolayers 18, or the lower electrode 16 is controlled so that the adhesiveness between the surface of the stamp 30 and the self-assembled monolayers 18 is weaker than that between part of the lower electrode 16 on which the low affinity regions A2 or the high affinity regions A1 are formed, and the self-assembled monolayers 18. This enables the transfer treatment to be controlled favorably.

In the forming method of self-assembled monolayers, as shown in FIG. 9C, after the stamp 30 is pressed to the surface of the lower electrode 16 so as to bond the self-assembled monolayers 18 to the lower electrode 16, the self-assembled monolayers 18 are preferably separated from the stamp 30 through ablation. Specifically, for example, the stamp 30 is formed of a transparent material. Then, by radiating a laser (excimer laser, for example) beam in the ultraviolet range from the back surface of the stamp 30, laser ablation is caused between the stamp 30 and the self-assembled monolayers 18 thereon. The laser ablation is a technique in which a beam in the ultraviolet range is radiated so as to cause a gas and so forth by optical absorption energy of the beam at an interface between a solid and a film, and thereby separating the solid from the film. This enables the self-assembled monolayers 18 to be separated from the stamp 30 favorably.

(Method of Manufacturing a Ferroelectric Device)

Next, a method of manufacturing a ferroelectric device according to one exemplary embodiment of the present invention will now be described. A ferroelectric device has a structure in which a ferroelectric layer, an upper electrode, and a lower electrode that are disposed in a manner of sandwiching the ferroelectric layer, are included. The structure is similar to that of the above piezoelectric device. Therefore, the forming method of a ferroelectric device of the present exemplary embodiment is similar to that of the piezoelectric device described above.

Namely, in the forming method of a ferroelectric device of the present exemplary embodiment, an insulating layer and a buffer layer are formed on a substrate first, and then a process of forming a lower electrode composed of strontium ruthenate (SRO) is implemented. Next, in order to form a ferroelectric layer having a given planar shape, a process of forming a plurality of regions whose wettability with respect to a ferroelectric material and so forth is different from each other on the surface of the lower electrode, is implemented. Specifically, a first region that has high affinity for a ferroelectric material and a second region whose affinity for the ferroelectric material is lower than that of the first region.

Subsequently, a process of forming a ferroelectric layer having a given planar shape is implemented. In this process, by utilizing the differences in deposition speed of the ferroelectric material and in adhesiveness with the lower electrode between the regions that are caused by the difference in affinity between the first and second regions, the ferroelectric material is selectively grown. As the forming method of a ferroelectric layer, as described above, there can be used a mist method, CVD and the like, a method using a mist method and an ion beam assisted method, a method using CVD and the like and an ion beam assisted method, a method in which a ferroelectric material (solution including a ferroelectric material) is provided on a lower electrode and then degreasing is carried out, and thereafter an ion beam is radiated, for example. Thereafter, a process of forming an upper electrode on the ferroelectric layer is implemented, and thereby a ferroelectric device such as a ferroelectric memory (FeRAM) having a structure in which the piezoelectric layer, the upper electrode, and the lower electrode that are disposed in a manner of sandwiching the piezoelectric layer are included, is manufactured.

In the above forming method of a piezoelectric device, the piezoelectric layers 20 are formed into (100)-orientation, in which voltage displacement amount (variation amount with respect to applied voltage) is large. However, in the case of a ferroelectric device, small voltage displacement amount is preferable. Therefore, a lower electrode is preferably formed into (001)-orientation or (111)-orientation, and a ferroelectric layer is also preferably formed into (001)-orientation or (111)-orientation.

As a material of a ferroelectric layer, lead titanate ($PbTiO_3$), lead zirconate titanate ($Pb(Zr, Ti)O_3$:PZT), lead zirconate ($PbZrO_3$), lead lanthanum titanate (($Pb, La)TiO_3$), lead lanthanum zirconate titanate (($Pb, La)(Zr, Ti)O_3$), lead magnesium niobate-lead zirconium titanate ($Pb(Zr, Ti)(Mg, Nb)O_3$), or the like can be used. Otherwise, SBT including Sr, Bi, Ta as component elements can also be used.

(Droplet Ejection Head)

Next, a droplet ejection head according to one exemplary embodiment of the present invention will now be described.

Figure 10:
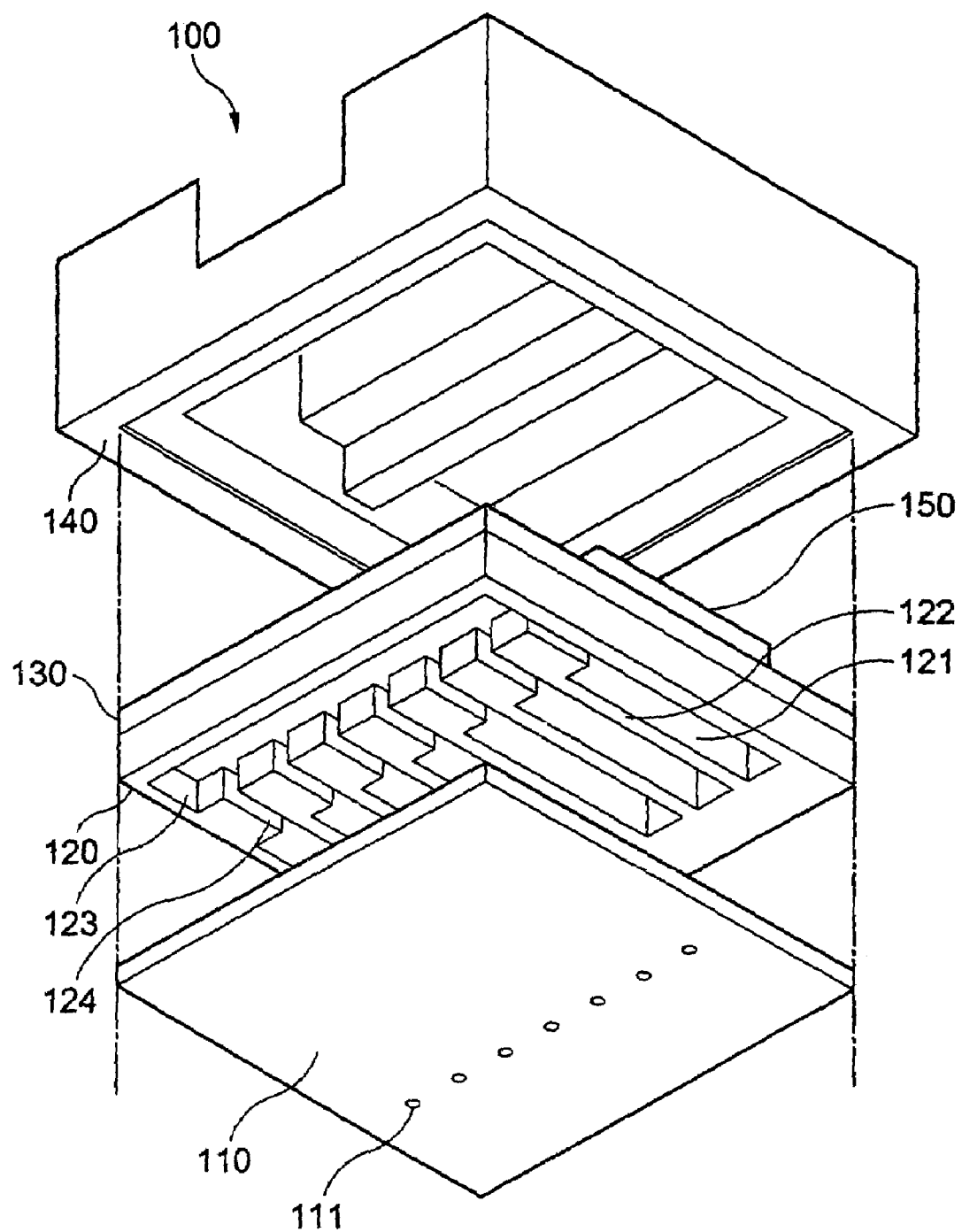
FIG. 10 is an exploded schematic perspective view of a droplet ejection head according to one exemplary embodiment of the present invention.
Figure 11:
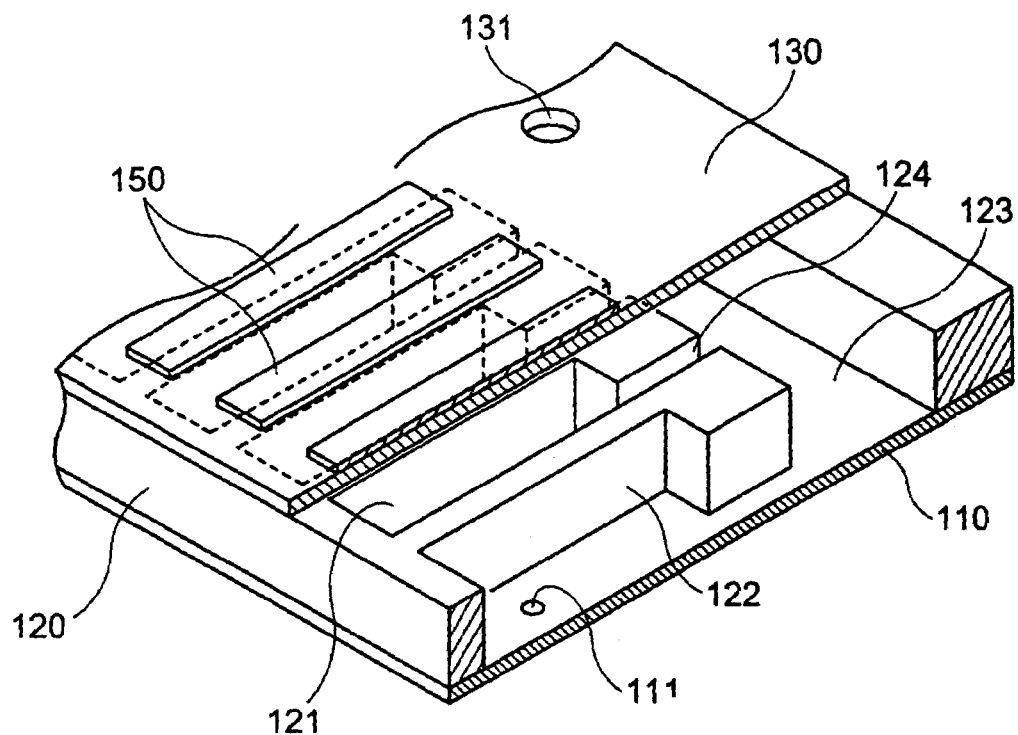
FIG. 11 is a schematic perspective view showing part of a significant portion of the droplet ejection head according to one exemplary embodiment of the present invention.

FIG. 10 is a schematic perspective view of a droplet ejection head according to one exemplary embodiment of the present invention. FIG. 11 is a schematic perspective view showing part of a major portion of the droplet ejection head according to one exemplary embodiment of the present invention. A droplet ejection head 100 shown in FIG. 10 includes a nozzle plate 110, a pressure chamber substrate 120, a diaphragm 130, and a case 140.

As shown in FIG. 10, the pressure chamber substrate 120 includes cavities 121, sidewalls 122, a reservoir 123, and supply ports 124. The cavities 121 are pressure chambers, and are formed by etching a substrate such as silicon. The sidewalls 122 are constituted in a manner of dividing between the cavities 121. The reservoir 123 is a common channel that can supply ink to each of the cavities 121 at ink filling time. The supply ports 124 can introduce ink to each of the cavities 121.

As shown in FIG. 11, the diaphragm 130 can be attached to one surface of the pressure chamber substrate 120. Piezoelectric elements 150 that are part of the above piezoelectric device are formed on the diaphragm 130. The piezoelectric elements 150 are ferroelectric crystals having a perovskite structure and are formed in a given shape on the diaphragm 130. The nozzle plate 110 is attached to the pressure chamber substrate 120 so that nozzle holes 111 are disposed at positions corresponding to each of the cavities 121 (pressure chamber) provided in the pressure chamber 120 in plural. Furthermore, the pressure chamber 120 to which the nozzle plate 110 is attached is set in the case 140 so as to constitute the droplet ejection head 100 as shown in FIG. 10.

Figure 12:
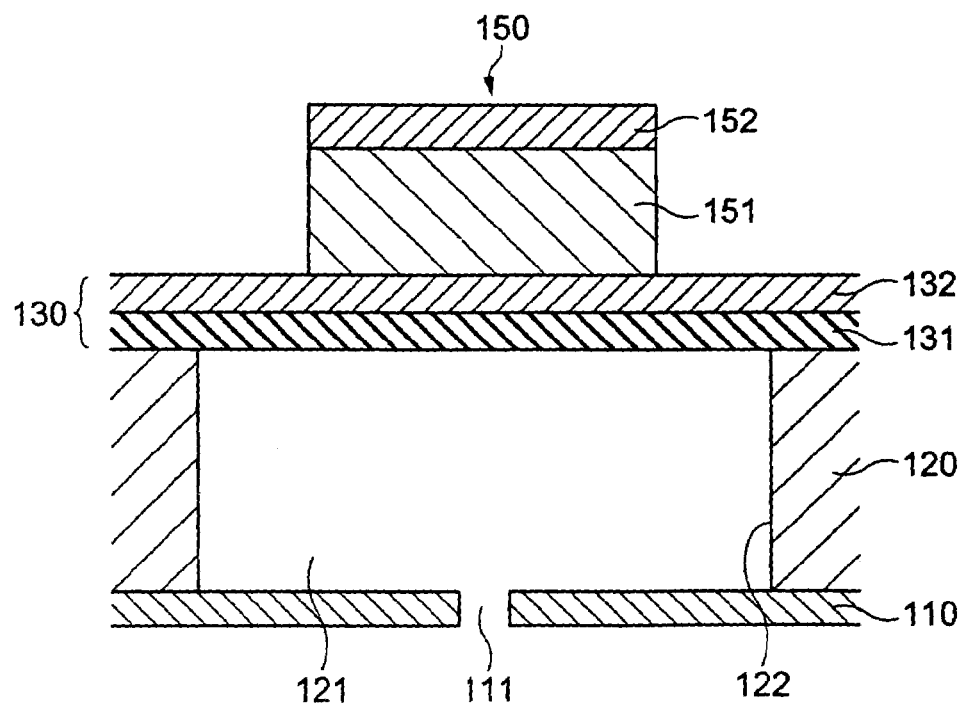
FIG. 12 is a schematic sectional view showing part of a significant portion of the droplet ejection head according to one exemplary embodiment of the present invention.

FIG. 12 is a schematic sectional view showing part of a major portion of a droplet ejection head according to one exemplary embodiment of the present invention. As shown in FIG. 12, the diaphragm 130 is constituted by stacking an insulating film 131 and a lower electrode 132. The piezoelectric element 150 is constituted by stacking a piezoelectric layer 151 and an upper electrode 152. The piezoelectric device is made up of the lower electrode 132, the piezoelectric layer 151, and the upper electrode 152.

The insulating film 131 is formed of a non-conductive material, for example silicon dioxide formed by thermally oxidizing a silicon substrate, and can be deformed by the volume change of the piezoelectric layer so as to enhance the pressure inside of the cavities 121 instantly. The lower electrode 132 is an electrode that makes a pair with the upper electrode 152 to apply voltage to the piezoelectric layer, and is composed of SRO (strontium ruthenate).

The piezoelectric layer 151 is formed of the above described PZT (lead zirconate titanate ($Pb(Zr, Ti)O_3$)) and so forth. If the piezoelectric layer 151 is too thick, the thickness of the whole layers becomes large such that high driving voltage is required. If it is too thin, variation in the characteristics of piezoelectric elements is caused since film thickness can not be uniformed, and the number of manufacturing processes increases, such that manufacturing at appropriate cost becomes impossible. Therefore, the thickness of the piezoelectric layer 151 is preferably 500–2000 nanometers. The upper electrode 152 is the other of electrodes to apply voltage to the piezoelectric layer, and is composed of an electrically conductive material, for example, platinum, gold, and so forth of film thickness of 0.1 micrometers. If used for a surface acoustic wave element or a filter, besides the above materials, ZnO, which is not a ferroelectric material but a piezoelectric material, may be used.

The piezoelectric element 150 is manufactured by using a manufacturing method shown in the above exemplary embodiments. Therefore, a number of the piezoelectric elements 150 having a good electric characteristic and high reliability can be manufactured through easy manufacturing processes. Moreover, since etching is not required when forming the piezoelectric layer 151 of the piezoelectric element 150, damage due to etching is not caused in the manufactured piezoelectric element. Thus, a droplet ejection head incorporating a piezoelectric element having an excellent piezoelectric characteristic can be provided.

(Electronic Equipment)

Figure 13:
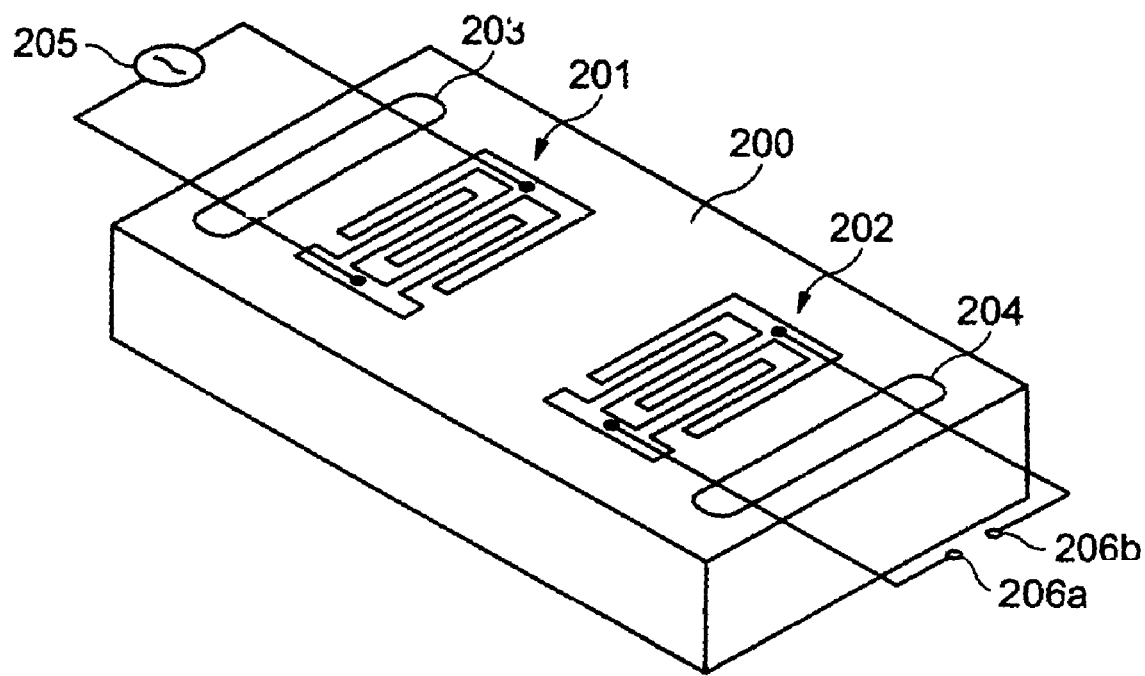
FIG. 13 is a schematic perspective view showing the outline of a surface acoustic wave sensor as electronic equipment according to one exemplary embodiment of the present invention.

Next, electronic equipment according to one exemplary embodiment of the present invention will now be described. FIG. 13 is a schematic perspective view showing the outline of a surface acoustic wave sensor as electronic equipment according to one exemplary embodiment of the present invention. As shown in FIG. 13, a surface acoustic wave sensor includes a substrate 200. In the present exemplary embodiment, a substrate on which piezoelectric layers are formed by the above methods is used as the substrate 200. Namely, a substrate including the piezoelectric layer 20 formed above the substrate 10 shown in FIG. 1 with the insulating layer 12, the buffer layer 14, and the lower electrode 16 therebetween, is used.

On the top surface of the substrate 200, IDT (interdigital type) electrodes 201 and 202 are formed. The IDT electrodes 201 and 202 are formed of Al (aluminum) or Al alloy for example. Acoustic absorbing portions 203 and 204 are formed on the upper surface of the substrate 200 in a manner of sandwiching the IDT electrodes 201 and 202. The acoustic absorbing portions 203 and 204 are elements that absorb surface acoustic waves transmitting on the surface of the substrate 200. A power source 205 is coupled to the IDT electrode 201 formed on the substrate 200. A signal line is coupled to the IDT electrode 202.

In the above structure, an input from the power source 205 to the IDT electrode 201 allows a surface acoustic wave to be excited on the upper surface of the substrate 200. This surface acoustic wave is transmitted in the top surface of the substrate 200 at the speed of about 5000 m/s. The surface acoustic waves transmitted from the IDT electrode 201 to the acoustic absorbing portion 203 side are absorbed by the acoustic absorbing portion 203. Meanwhile, out of the surface acoustic waves transmitted to the IDT electrode 202 side, the surface acoustic waves in a certain band that is determined according to the pitch and so forth of the IDT electrode 202 are converted into electric signals so as to be extracted from terminals 206a and 206b through the signal line. The most part of surface acoustic waves of components other than components in the certain band, pass though the IDT electrode 202 so as to be absorbed by the acoustic absorbing portion 204. Such a surface acoustic wave sensor reacts with changes of an external environment extremely sensitively. Namely, the transmitting speed of a surface acoustic wave changes depending on temperature, external force, gas adsorption, and so forth, and the displacement can be output as an electrical signal.

In the surface acoustic wave sensor of the above structure, the piezoelectric layer formed on the substrate 200 is formed by the manufacturing method of the above exemplary embodiment, and thus has high crystallinity in which crystal orientation is aligned to a desired direction. Moreover, since the manufacturing is easy and etching is not required when forming a piezoelectric pattern, a piezoelectric layer does not suffer damage by etching. Therefore, an excellent surface acoustic wave characteristic can be obtained.

Figure 14:
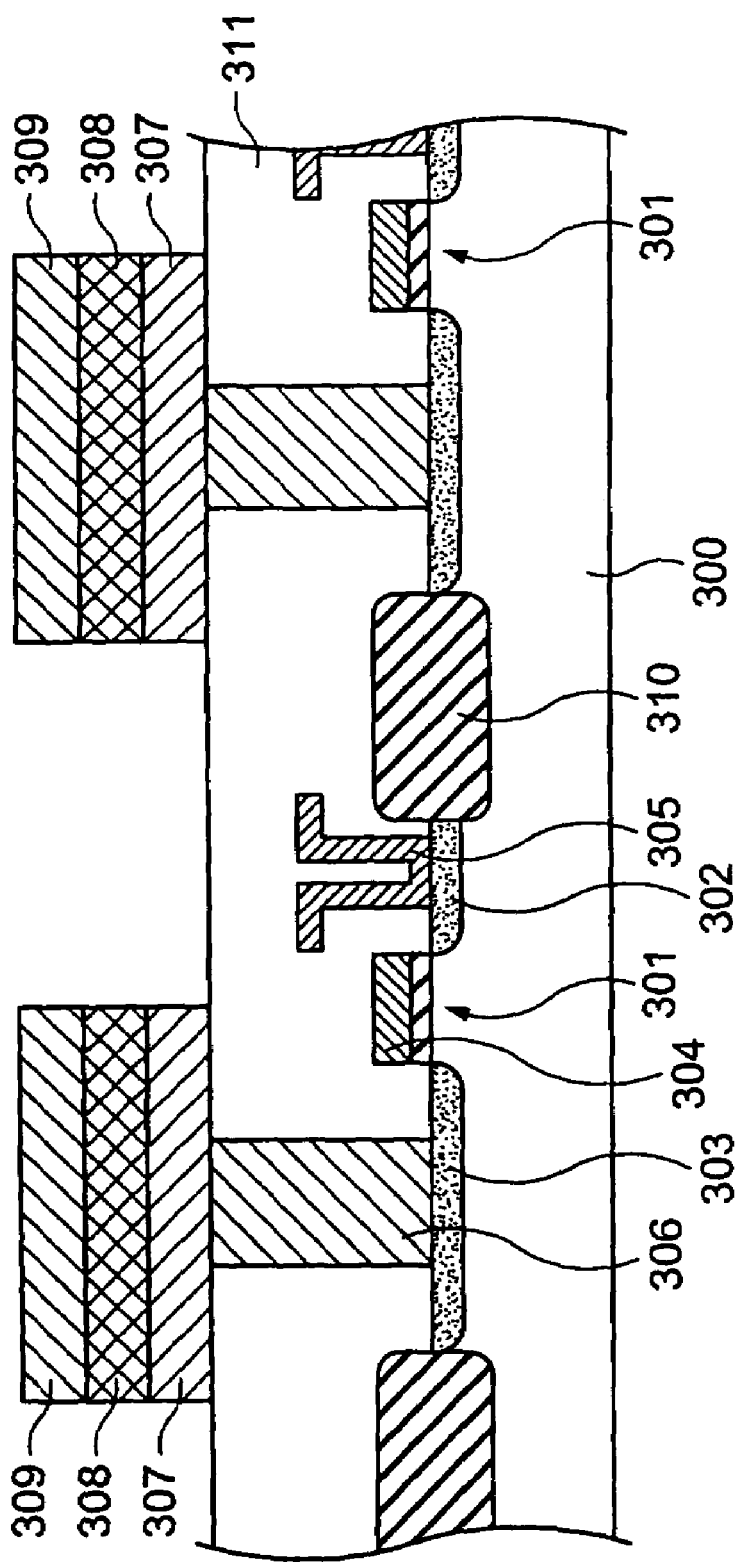
FIG. 14 is a schematic sectional view showing the structure of a ferroelectric memory as electronic equipment according to another exemplary embodiment of the present invention.

Next, electronic equipment according to another exemplary embodiment of the present invention will now be described. FIG. 14 is a schematic sectional view showing the structure of a ferroelectric memory as electronic equipment according to another exemplary embodiment of the present invention. A ferroelectric memory is a type of non-volatile semiconductor storage device. The minimum unit for information storage is a memory cell. For example, one transistor and one capacitor part are combined to constitute a memory cell. A plurality of such memory cells is arranged to constitute a memory array. In this case, the plurality of memory cells can be arranged in a plurality of rows and a plurality of columns regularly.

In a ferroelectric memory shown in FIG. 14, a transistor 301 constituting a part of the memory cell is formed on a substrate 300 such as a semiconductor wafer. The transistor 301 is a thin film transistor (TFT) for example, and includes a drain 302, a source 303, and a gate electrode 304. An electrode 305 coupled to the drain 302 is coupled to a bit line (not shown), and the gate electrode 304 is coupled to a word line (not shown). An electrode (plug) 306 coupled to the source 303 is coupled to a first electrode 307 of a capacitor part of the ferroelectric memory element. Each memory cell is separated from each other by a LOCOS (Local Oxidation of Silicon) 310, and an interlayer insulating film 311 composed of $SiO_2$ and so forth is formed on the transistor 301.

A ferroelectric layer 308 is formed on the first electrode 307, and a second electrode 309 is formed on the ferroelectric layer 308. The first electrode 307, the ferroelectric layer 308, and the second electrode 309 constitute the capacitor portion. The first electrode 307 is formed of SRO (strontium ruthenate). The ferroelectric layer 308 is formed of PZT and so forth. The second electrode 309 is formed of platinum, gold, and so forth. This capacitor portion is formed by using the method of manufacturing a ferroelectric device according to the above exemplary embodiment of the present invention.

In the above description, a surface acoustic wave sensor has been described by way of example as electronic equipment including the piezoelectric device manufactured by using the manufacturing method according to exemplary embodiments of the present invention. However, the electronic equipment of exemplary embodiments of the present invention is not limited to a surface acoustic wave sensor, but includes various kinds of electronic equipment such as a piezoelectric actuator, a thin film capacitor, a frequency filter, an optical wave guide, an optical storage device, and a spatial light modulator.

Furthermore, as electronic equipment including a piezoelectric device or ferroelectric device manufactured by using the manufacturing method according to exemplary embodiments of the present invention, there is various electronic equipment such as a notebook computer, a cellular phone, a personal computer (PC), an engineering work station (EWS), a pager, a PDA (Personal Data Assistance), a word processor, a television, a video tape recorder, an electronic notebook, an electronic desktop calculator, a car navigation device, a POS terminal, game equipment and peripheral devices thereof, and portable memory.

What is claimed is:

1. A method of manufacturing a piezoelectric device, the method comprising:
   forming an insulating layer over a substrate;
   forming a buffer layer on the insulating layer by providing an atom of metal material to the insulating layer and irradiating the insulating layer with an ion beam, the buffer layer including the atom of metal material;

forming a first electrode on the buffer layer by providing an atom of strontium ruthenate to the buffer layer and irradiating the buffer layer with an ion beam, the first electrode including the atom of strontium ruthenate;

forming a piezoeletric layer on the first electrode by providing a mist to form a precursor film of the piezoeletric layer on the first electrode and irradiating the precursor film with an ion beam, the mist including a piezoeletric material of which the piezoeletric layer is composed; and forming a second electrode over the piezoeletric layer.

2. The method of manufacturing a piezoelectrie device according to claim 1, the buffer layer having biaxially orientation, the buffer layer having a layered perovskite structure.

3. The method of manufacturing a piezoelectric device according to claim 1, the first electrode having peroyskite-like crystalline structure.

4. The method of manufacturing a piezoelectric device according to claim 1, the first electrode having perovskite-like crystalline structure and the piezoelectric layer having perovskite-like crystalline structure that is influenced by the perovskite-like crystalline structure of the first electrode.

5. The method of manufacturing a piezoelectric device according to claim 1, the first electrode having a first portion and a second portion, an affinity of the first portion for the mist being higher than an affinity of the second portion for the mist.

6. The method of manufacturing a piezoelectric device according to claim 1, a radiation angle of the ion beam with respect to a normal line direction of a surface of the buffer layer being in a range between 35 to 65 degrees in the process of forming the piezoelectric layer.

7. The method of manufacturing a piezoelectric device according to claim 1, the ion beam being generated using an ion of an element that is composed of one of an inert gas and an ion of oxygen.

8. The method of manufacturing a piezoelectric device according to claim 1, a plurality of atoms that compose the piezoelectric material being arranged by the ion beam.

9. A method of manufacturing a piezoelectric device, the method comprising:

forming a buffer layer over a substrate;

forming a first electrode on the buffer layer by providing an atom of strontium ruthenate to the buffer layer and irradiating the buffer layer with an ion beam, the first electrode including the atom of strontium ruthenate;

forming a piezoelectric layer on the first electrode by providing a mist to form a precursor film of the piezoelectric layer on the first electrode and irradiating the precursor film with an ion beam, the mist including a piezoelectric material of which the piezoelectric layer is composed; and forming a second electrode over the piezoelectric layer.

10. A method of manufacturing a piezoelectric device, the method comprising:

forming a first electrode over a substrate;

forming a piezoelectric layer on the first electrode by providing a mist to form a precursor film of the piezoelectric layer on the first electrode and irradiating the precursor film with an ion beam, the mist including a piezoelectric material of which the piezoelectric layer is composed; and forming a second electrode over the piezoelectric layer.

11. The method of manufacturing a piezoelectric device according to claim 10, the first electrode having a first portion and a second portion, an affinity of the first portion for the mist being higher than an affinity of the second portion for the mist.

12. The method of manufacturing a piezoelectric device according to claim 10, a radiation angle of the ion beam with respect to a normal line direction of a surface of the buffer layer being in a range between 35 to 65 degrees in the process of forming the piezoelectric layer.

13. The method of manufacturing a piezoelectric device according to claim 10, the mist being evaporated after being disposed on the first electrode to form the precursor film.

* * * * *